(12) United States Patent
Guo et al.

(10) Patent No.: US 11,557,532 B2
(45) Date of Patent: Jan. 17, 2023

(54) MONOLITHIC 3D INTEGRATION INTER-TIER VIAS INSERTION SCHEME AND ASSOCIATED LAYOUT STRUCTURE

(71) Applicant: Taiwan Semiconductor Manufacturing Company, Ltd., Hsin-Chu (TW)

(72) Inventors: Ta-Pen Guo, Taipei (TW); Carlos H. Diaz, Mountain View, CA (US); Jean-Pierre Colinge, Hsinchu (TW); Yi-Hsiung Lin, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 179 days.

(21) Appl. No.: 17/007,821

(22) Filed: Aug. 31, 2020

(65) Prior Publication Data

US 2020/0402899 A1    Dec. 24, 2020

Related U.S. Application Data

(60) Continuation of application No. 16/220,148, filed on Dec. 14, 2018, now Pat. No. 10,763,198, which is a
(Continued)

(51) Int. Cl.
*H01L 21/00* (2006.01)
*H01L 23/498* (2006.01)
(Continued)

(52) U.S. Cl.
CPC ...... *H01L 23/49827* (2013.01); *H01L 21/486* (2013.01); *H01L 21/4846* (2013.01);
(Continued)

(58) Field of Classification Search
CPC ......... H01L 23/49827; H01L 21/4846; H01L 21/486
See application file for complete search history.

(56) References Cited

U.S. PATENT DOCUMENTS 5,835,396 A * 11/1998 Zhang .................... G11C 17/16
257/E27.073
5,864,496 A *  1/1999 Mueller ............. H01L 27/10891
257/E21.651
(Continued)

FOREIGN PATENT DOCUMENTS

CN         104637521 B   * 12/2017  ............. G11C 5/063

OTHER PUBLICATIONS

German Patent and Trademark Office, German Patent Office Action dated May 11, 2016, for Application No. 10 2015 114 913 3, 10 pages.
(Continued)

*Primary Examiner* — Laura M Menz
(74) *Attorney, Agent, or Firm* — Haynes and Boone, LLP

(57) ABSTRACT

A 3D-IC includes a first tier device and a second tier device. The first tier device and the second tier device are vertically stacked together. The first tier device includes a first substrate and a first interconnect structure formed over the first substrate. The second tier device includes a second substrate, a doped region formed in the second substrate, a dummy gate formed over the substrate, and a second interconnect structure formed over the second substrate. The 3D-IC also includes an inter-tier via extends vertically through the second substrate. The inter-tier via has a first end and a second end opposite the first end. The first end of the inter-tier via is coupled to the first interconnect structure.
(Continued)

The second end of the inter-tier via is coupled to one of: the doped region, the dummy gate, or the second interconnect structure.

20 Claims, 19 Drawing Sheets

Related U.S. Application Data division of application No. 15/630,685, filed on Jun. 22, 2017, now Pat. No. 10,170,404, which is a division of application No. 14/840,364, filed on Aug. 31, 2015, now Pat. No. 9,691,695.

(51) Int. Cl.
| | |
|---|---|
| *H01L 27/092* | (2006.01) |
| *H01L 21/48* | (2006.01) |
| *H01L 27/06* | (2006.01) |
| *H01L 23/48* | (2006.01) |

(52) U.S. Cl.
CPC .......... *H01L 23/481* (2013.01); *H01L 23/498* (2013.01); *H01L 23/49844* (2013.01); *H01L 27/0688* (2013.01); *H01L 27/092* (2013.01)

(56) References Cited

U.S. PATENT DOCUMENTS

| | | | | |
|---|---|---|---|---|
| 5,973,953 A * | 10/1999 | Yamashita | ............. | G11C 5/063 365/63 |
| 6,504,255 B2 * | 1/2003 | Keeth | ................. | G11C 11/4097 257/776 |
| 6,657,880 B1 * | 12/2003 | Callahan | ................ | G11C 5/063 365/69 |
| 7,564,115 B2 | 7/2009 | Chen et al. | | |
| 7,564,134 B2 * | 7/2009 | Yang | .................. | H01L 27/1104 257/E27.098 |
| 7,633,165 B2 | 12/2009 | Hsu et al. | | |
| 7,821,039 B2 * | 10/2010 | Tien | ....................... | H01L 27/092 257/532 |
| 7,825,024 B2 | 11/2010 | Lin et al. | | |
| 7,919,792 B2 * | 4/2011 | Law | .................. | H01L 27/11807 257/209 |
| 7,973,413 B2 | 7/2011 | Kuo et al. | | |
| 8,105,875 B1 | 1/2012 | Hu et al. | | |
| 8,158,456 B2 | 4/2012 | Chen et al. | | |
| 8,183,578 B2 | 5/2012 | Wang | | |
| 8,183,579 B2 | 5/2012 | Wang | | |
| 8,223,525 B2 * | 7/2012 | Balakrishnan | ....... | G11C 13/025 365/174 |
| 8,227,902 B2 | 7/2012 | Kuo | | |
| 8,278,152 B2 | 10/2012 | Liu et al. | | |
| 8,426,961 B2 | 4/2013 | Shih et al. | | |
| 8,467,258 B2 * | 6/2013 | Lin | ........................ | G11C 29/44 714/773 |
| 8,563,403 B1 | 10/2013 | Farooq et al. | | |
| 8,581,414 B2 | 11/2013 | Fujita | | |
| 8,669,174 B2 | 3/2014 | Wu et al. | | |
| 8,802,504 B1 | 8/2014 | Hou et al. | | |
| 8,803,292 B2 | 8/2014 | Chen et al. | | |
| 8,803,316 B2 | 8/2014 | Lin et al. | | |
| 9,202,557 B2 * | 12/2015 | Wang | .................. | H01L 27/0688 |
| 9,524,920 B2 * | 12/2016 | Lin | ........................... | G11C 7/18 |
| 9,691,695 B2 * | 6/2017 | Guo | ..................... | H01L 27/0688 |
| 10,163,759 B2 * | 12/2018 | Lin | ..................... | H01L 25/0657 |
| 10,170,404 B2 * | 1/2019 | Guo | ..................... | H01L 23/49844 |
| 10,283,171 B2 * | 5/2019 | Chi | ......................... | G11C 5/025 |
| 10,651,114 B2 * | 5/2020 | Lin | ......................... | H01L 23/481 |
| 10,763,198 B2 * | 9/2020 | Guo | ..................... | H01L 27/0688 |
| 10,790,015 B2 * | 9/2020 | Singh | ........................ | G11C 8/16 |
| 2003/0147266 A1 * | 8/2003 | Vyvoda | .................. | G11C 16/20 365/189.02 |
| 2003/0185033 A1 * | 10/2003 | Fricke | .................... | H01L 23/522 257/E27.102 |
| 2010/0264551 A1 | 10/2010 | Farooq et al. | | |
| 2011/0018064 A1 * | 1/2011 | Doornbos | ........... | H01L 27/0207 257/E21.409 |
| 2011/0133339 A1 | 6/2011 | Wang | | |
| 2011/0287600 A1 | 11/2011 | Cheng et al. | | |
| 2012/0304142 A1 | 11/2012 | Morimoto et al. | | |
| 2013/0021060 A1 * | 1/2013 | Or-Bach | ................ | H01L 23/544 438/129 |
| 2013/0021569 A1 * | 1/2013 | Iwamoto | ................ | G02F 1/1393 349/130 |
| 2013/0083436 A1 * | 4/2013 | Tseng | ....................... | H01L 23/60 438/667 |
| 2013/0171820 A1 | 7/2013 | Boyd et al. | | |
| 2013/0258746 A1 * | 10/2013 | Kurokawa | ........... | H01L 27/0688 365/72 |
| 2013/0267046 A1 | 10/2013 | Or-Bach et al. | | |
| 2014/0001645 A1 | 1/2014 | Lin et al. | | |
| 2014/0027821 A1 * | 1/2014 | Wu | .................... | H01L 21/28123 438/585 |
| 2014/0070366 A1 * | 3/2014 | Yen | .................... | H01L 29/66181 257/532 |
| 2014/0225258 A1 | 8/2014 | Chiu et al. | | |
| 2014/0226117 A1 * | 8/2014 | Nomura | ............. | G02F 1/134309 349/130 |
| 2014/0252572 A1 | 9/2014 | Hou et al. | | |
| 2014/0269022 A1 * | 9/2014 | Xie | ......................... | G11C 5/025 438/106 |
| 2014/0354929 A1 * | 12/2014 | Kobayashi | ........ | G02F 1/133784 349/123 |
| 2015/0130068 A1 * | 5/2015 | Lin | ......................... | H01L 23/481 257/773 |
| 2015/0235949 A1 | 8/2015 | Yu et al. | | |
| 2015/0340316 A1 * | 11/2015 | Or-Bach | ............. | H01L 45/1226 257/401 |
| 2016/0056250 A1 * | 2/2016 | Chuang | ............. | H01L 29/42344 257/326 |
| 2016/0079167 A1 * | 3/2016 | Zhu | ..................... | H01L 27/0207 257/390 |
| 2016/0079175 A1 * | 3/2016 | Zhu | ..................... | H01L 23/53257 438/618 |
| 2016/0336075 A1 * | 11/2016 | Lee | ....................... | G11C 16/0483 |
| 2017/0062319 A1 * | 3/2017 | Guo | ..................... | H01L 23/498 |
| 2017/0098596 A1 * | 4/2017 | Lin | ......................... | G11C 5/063 |
| 2017/0287826 A1 * | 10/2017 | Guo | ..................... | H01L 23/481 |
| 2018/0145070 A1 * | 5/2018 | Fan | .................... | H01L 21/823475 |
| 2018/0269134 A1 * | 9/2018 | Lin | ..................... | H01L 25/0657 |
| 2019/0122960 A1 * | 4/2019 | Lin | ......................... | H01L 27/10 |
| 2019/0131230 A1 * | 5/2019 | Guo | ..................... | H01L 23/481 |

OTHER PUBLICATIONS

Taiwanese Notice of Allowance dated Feb. 18, 2017 for Application No. 104137123, 3 pages.

\* cited by examiner

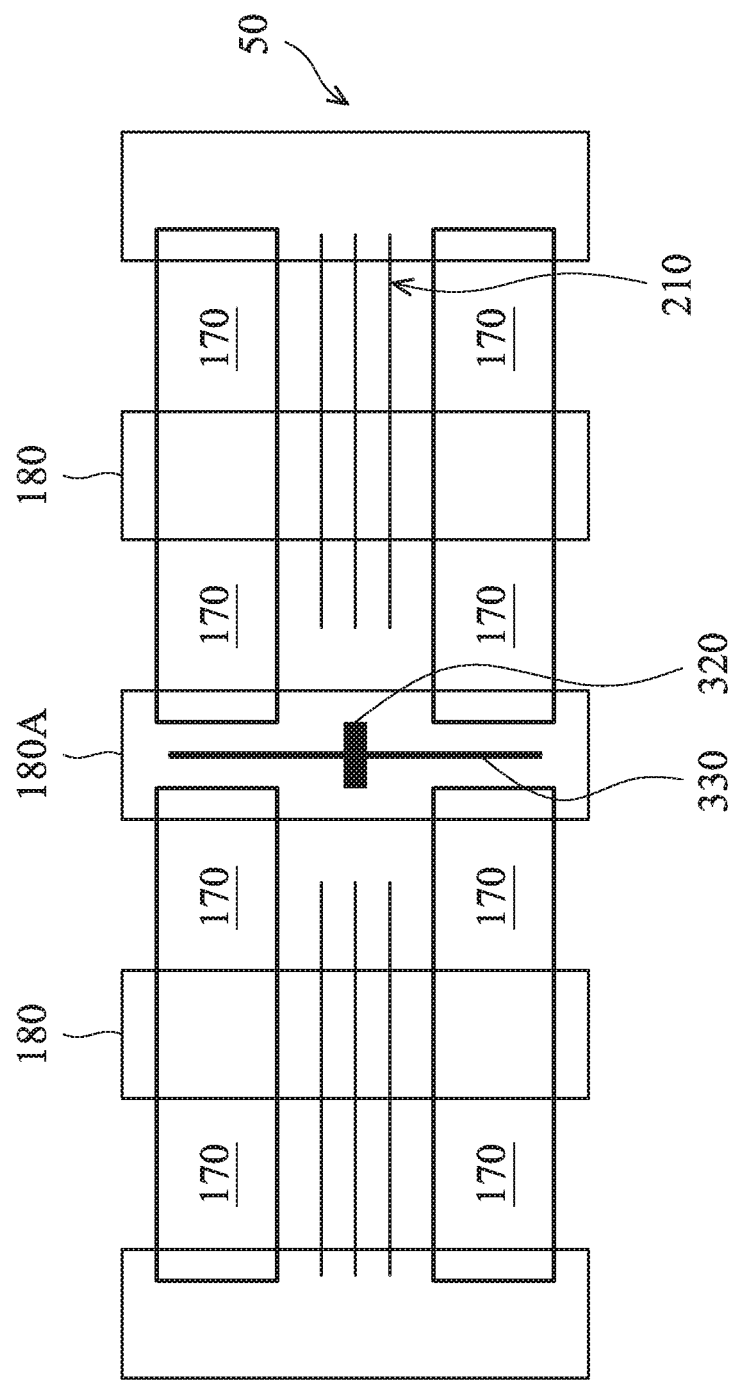

After "flipping"

MONOLITHIC 3D INTEGRATION INTER-TIER VIAS INSERTION SCHEME AND ASSOCIATED LAYOUT STRUCTURE

PRIORITY DATA

The present application is a continuation of U.S. patent application Ser. No. 16/220,148, filed Dec. 14, 2018, which is a divisional of U.S. patent application Ser. No. 15/630,685, filed Jun. 22, 2017, now U.S. Pat. No. 10,170,404, issued Jan. 1, 2019, entitled "MONOLITHIC 3D INTEGRATION INTER-TIER VIAS INSERTION SCHEME AND ASSOCIATED LAYOUT STRUCTURE," which is a divisional of U.S. patent application Ser. No. 14/840,364, filed Aug. 31, 2015, now U.S. Pat. No. 9,691,695, issued Jun. 27, 2017, the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

The integration density of various electronic components (e.g., transistors, diodes, resistors, capacitors, etc.) is improved by continual reductions in minimum feature size, which allow more components to be integrated into a given area. These smaller electronic components also require smaller packages that utilize less area than packages of the past in some applications. Thus, new packaging technologies, such as a three dimensional (3D) packaging, have been developed. However, even for ICs with 3D packaging (referred to as 3D-ICs), layout area has not been fully optimized, and routing flexibility—though better than 2D packaging ICs—still needs improvement.

Therefore, while conventional 3D-ICs have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A-5A are diagrammatic fragmentary top views of a portion of a 3D-IC in accordance with some embodiments of the present disclosure.

FIGS. 1B-5B are diagrammatic fragmentary cross-sectional side views of a portion of a 3D-IC in accordance with some embodiments of the present disclosure.

DETAILED DESCRIPTION

Figure 1A:
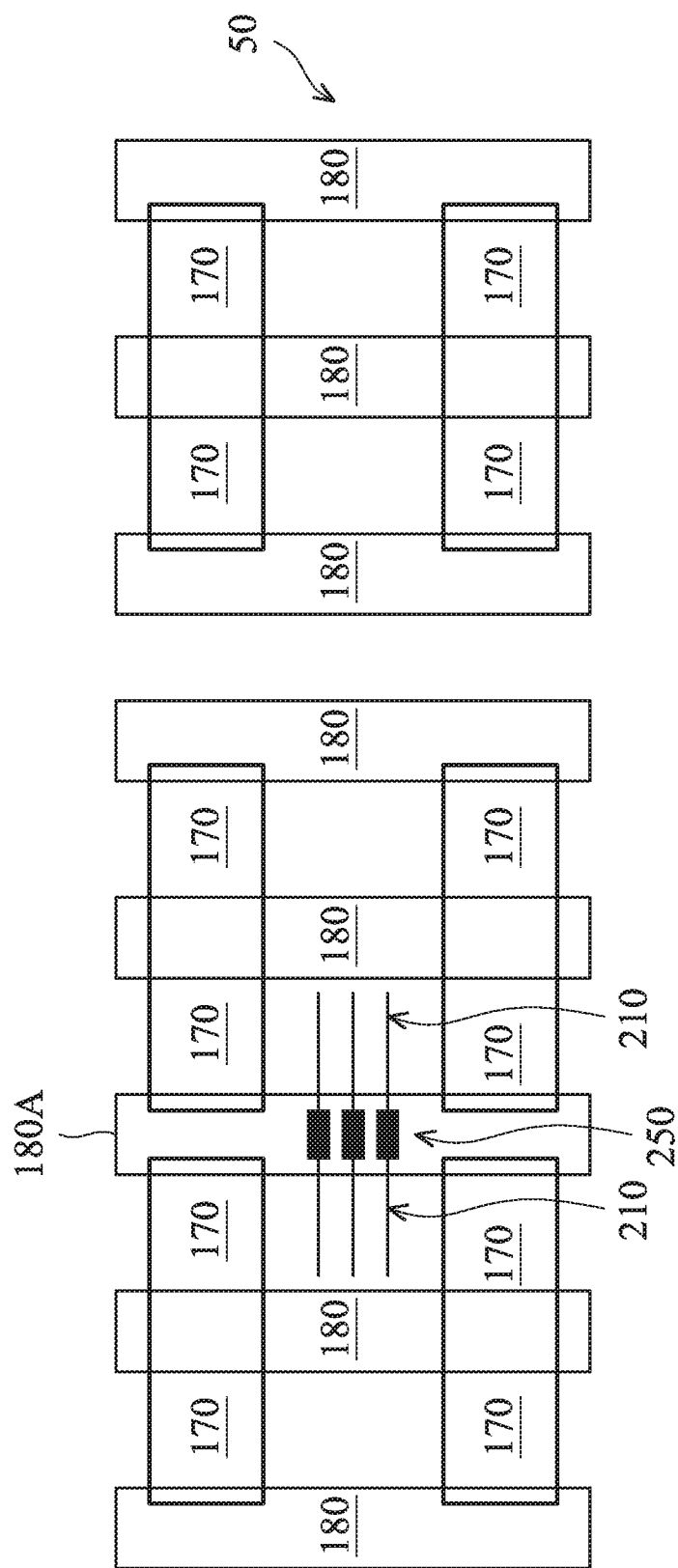

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the scaling down process for semiconductor Integrated Circuits (ICs) continues, the shrinking device sizes have led to ICs with smaller die area and higher device densities. In that regard, 3D-ICs have been developed to effectively increase the number of semiconductor devices on a chip without enlarging the horizontal dimensions of the chip. In a typical 3D-IC, dies are either bonded on interposers, package substrates, or stacked vertically on other dies. However, conventional 3D-ICs may still suffer from shortcomings such as inefficient use of silicon area to facilitate electrical routing between a top die and a bottom die vertically stacked together.

To overcome the problems associated with conventional 3D-ICs, the present disclosure uses inter-tier vias to electrically interconnect microelectronic components on a bottom tier die with microelectronic components on a top tier die vertically stacked on the bottom tier die. The various usage scenarios involving the inter-tier vias according to the present disclosure will now be discussed in more detail with reference to FIGS. 1A-5A, 5A-5B, 6A-6B, 7A-7C, 8A-8B, 9A-9B, and 10.

Figure 1B:
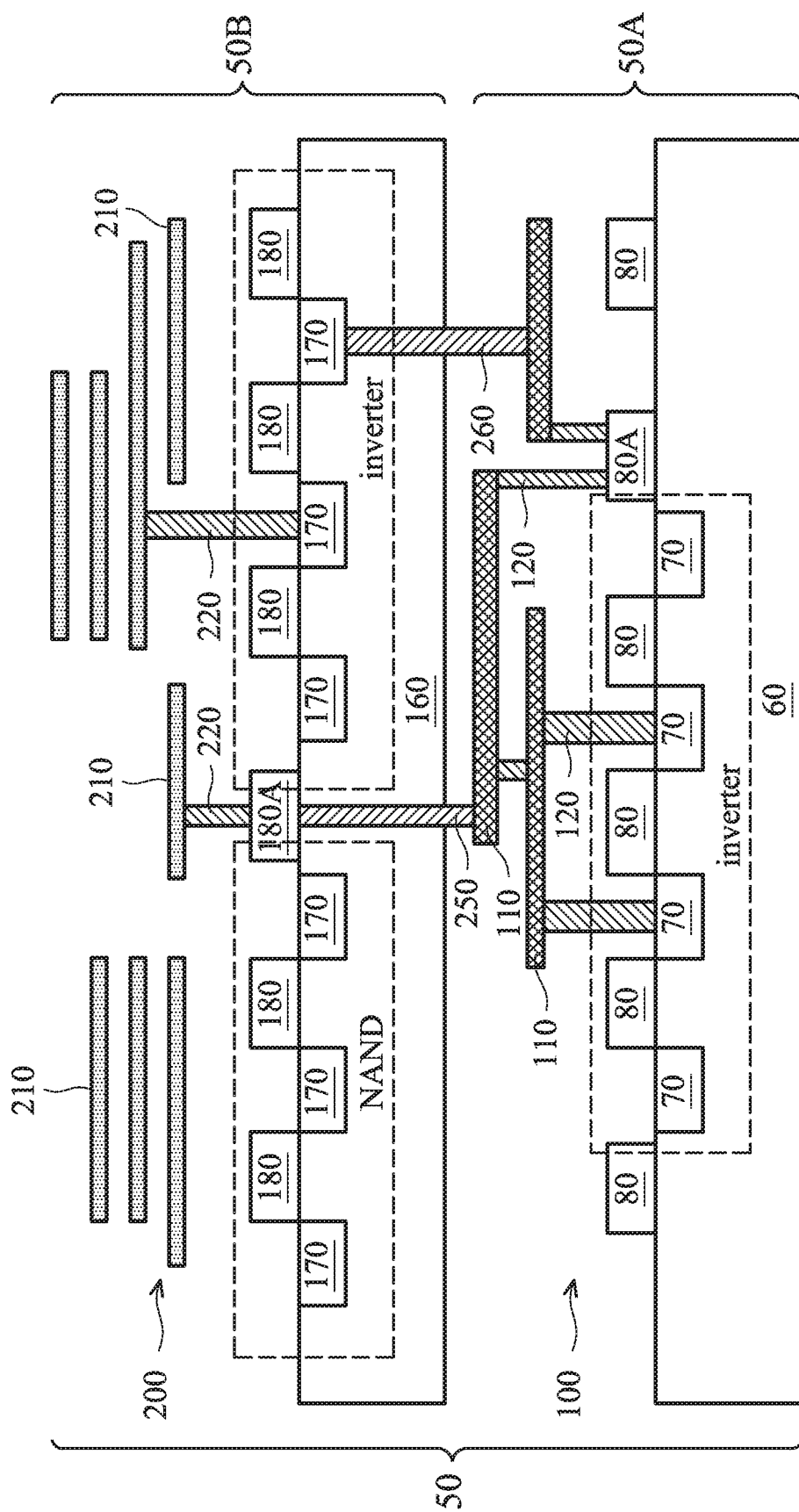

FIG. 1A is a diagrammatic fragmentary top view of a portion of a 3D-IC device 50, and FIG. 1B is a diagrammatic fragmentary cross-sectional side view of a portion of a 3D-IC device 50. The portion of the 3D-IC device 50 shown in FIG. 1A generally represents the portion of the 3D-IC device 50 shown in FIG. 1B, but it is understood that they may not have an exact one-to-one correspondence for reasons of simplicity.

As is shown clearly in the cross-sectional side view of FIG. 1B, the 3D-IC device 50 includes a bottom tier device 50A and a top tier device 50B. The bottom tier device 50A includes a substrate 60. The substrate 60 may contain various passive and active microelectronic devices (or portions thereof) such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors. In some embodiments, the substrate 60 is a silicon substrate doped with a p-type dopant such as boron (for example a p-type substrate). In other embodiments, the substrate 60 could be a silicon substrate that is doped with an n-type dopant such as phosphorous or arsenic (an n-type substrate).

As shown in FIG. 1B, a plurality of source/drains 70 may be formed in the substrate 60. A plurality of gates 80 may also be formed over the substrate 60. In some embodiments, the gates 80 each include a silicon oxide gate dielectric component and a polysilicon gate electrode component. In other embodiments, the gates 80 each include a high-k gate dielectric component and a metal gate electrode component. A high-k dielectric material is a material having a dielectric constant that is greater than a dielectric constant of $SiO_2$, which is approximately 4. In various embodiments, the high-k gate dielectric component may contain hafnium oxide $HfO_2$, $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, or SrTiO. The metal gate electrode component may include a work function metal (e.g., TiN, W, WN, W, or WAl) for tuning the work function of the gate, and a fill metal (e.g., Al, Ti, W, or Cu) for serving as the main electrically conductive portion of the gate electrode component.

According to the various aspects of the present disclosure, at least one of the gates 80A is a floating gate. The floating gate 80A is electrically floating. For example, the floating gate 80A is not electrically coupled to power supply rails VDD or VSS, and it is not considered part of a functional transistor. In the embodiment shown in FIG. 1B, the floating gate 80A is located at the edge of the inverter circuit of the bottom tier device 50A. The floating gate 80A is not considered a functional member of the inverter circuit. In that sense, the floating gate 80A may also be referred to as a dummy gate. Since the floating gate 80A is located in regions of the bottom tier device 50A that did not otherwise have any use—for example outside the inverter circuit—it does not waste or consumer extra layout space. In other words, the implementation of the floating gate 80A does not unnecessarily increase layout area of the bottom tier device 50A. Even without the floating gate 80A, the layout area would have been the same, since the source/drains 70 of the inverter circuit would have to be separated from adjacent circuits (not illustrated herein) anyway.

One or more suitable microelectronic circuits may be formed by the source/drains 70 and the gates 80. For example, an inverter circuit (represented by the dashed/broken lines in FIG. 1B) is formed in the portion of the bottom tier device 50A shown in FIG. 1B. Other microelectronic circuits formed in the bottom tier device 50A are not specifically illustrated herein for reasons of simplicity.

An interconnect structure 100 is formed over the substrate 60 of the bottom tier device 60. The interconnect structure 100 includes a plurality of metal layers that each contain a plurality of metal lines, for example metal lines 110 as shown in FIG. 1B. The interconnect structure 100 also includes a plurality of vias, for example vias 120, for electrically interconnecting the metal lines 110 with the microelectronic components on the substrate 60 (e.g., source/drains 70 or gates 80). For reasons of simplicity and clarity, not all the metal lines and the vias are specifically labeled with their corresponding reference numerals 110 and 120 in FIG. 1B.

After the formation of the bottom tier device 50A, the top tier device 50B is then formed on the bottom tier device 50A. The top tier device 50B includes a substrate 160. The substrate 160 may contain a similar material as the substrate 60 in some embodiments or may contain a different material than the substrate 60 in other embodiments. In some embodiments, the substrate 160 is formed over the bottom tier device 50A by a deposition process. The deposition process may be chemical vapor deposition (CVD), deposition of doped amorphous semiconductor followed by solid-phase epitaxial regrowth (SPER), epitaxial lateral overgrowth (ELO), epitaxy, or the like. In some embodiments, the substrate 160 may be substantially thinner than the substrate 60.

A plurality of doped regions such as source/drains 170 are formed in the substrate 160, and a plurality of gates 180 are formed over the substrate 160. Similar to the gates 80, the gates 180 may include a silicon oxide gate dielectric component and a polysilicon gate electrode component, or a high-k gate dielectric component and a metal gate electrode component. The source/drains 170 and the gates 180 are also shown in the top view of FIG. 1A. Note that at least one of the gates 180A is a floating gate. The floating gate 180A is electrically floating. For example, the floating gate 180A is not electrically coupled to power supply rails VDD or VSS, and it is not considered part of a functional transistor.

Various microelectronic circuit components may be formed by the source/drains 170 and the gates 180, for example a NAND circuit and an inverter circuit (represented by the dashed/broken lines in FIG. 1B). It is understood that other microelectronic circuits formed in the top tier device 50B are not specifically illustrated herein for reasons of simplicity. As shown in FIGS. 1A and 1B, the floating gate 180A is located in between two microelectronic circuit components, i.e., between the NAND circuit and the inverter circuit. The floating gate 180A is not considered a functional member of either the NAND circuit or the inverter circuit. In that sense, the floating gate 180A may also be referred to as a dummy gate. Since the floating gate 180A is located in regions of the top tier device 50B that did not otherwise have any use—for example between the NAND circuit and the inverter circuit—it does not waste or consumer extra layout space. In other words, the implementation of the floating gate 180A does not unnecessarily increase layout area of the top tier device 50B. Even without the floating gate 180A, the layout area would have been the same, since the source/drains 170 of the NAND circuit have to be separated from the source/drains 170 of the inverter circuit anyway.

According to the various aspects of the present disclosure, one or more inter-tier vias are formed to facilitate the electrical interconnections between various microelectronic components on the bottom tier device 50A and the top tier device 50B. Generally, an inter-tier via is a conductive element that extends vertically through an entire substrate, for example the substrate 160 of the top tier device 50B. The inter-tier via may contain a suitable metal material such as tungsten, aluminum, copper, or combinations thereof. The inter-tiers will be discussed in more detail below.

After the formation of the inter-tier vias, an interconnect structure 200 is formed over the substrate 160 of the top tier device 160. The interconnect structure 200 includes a plurality of metal layers that each contain a plurality of metal lines, for example metal lines 210 as shown in FIG. 1B. The interconnect structure 200 also includes a plurality of vias, for example vias 220, for electrically interconnecting the metal lines 210 with the components on the substrate 60 (e.g., source/drains 170 or gates 180). For reasons of simplicity and clarity, not all the metal lines and the vias are specifically labeled with their corresponding reference numerals 210 and 220 in FIG. 1B herein.

In FIG. 1B, an inter-tier via 250 is formed directly below the floating gate 180A of the top tier device 50B and directly above one of the metal lines 110 of the bottom tier device 50A. As such, the inter-tier via 250 electrically couples the floating gate 180A and the metal line 110 together. Since the floating gate 180A is also electrically coupled to one of the metal lines 210 (for example in a metal-1 layer of the interconnect structure 200 on the top tier device 50B), and since the metal line 110 is also electrically coupled to one or more microelectronic components (e.g., source/drains 70) of the inverter circuit on the bottom tier device 50A, the inter-tier via 250 and the floating gate 180A effectively allow the inverter circuit of the bottom tier device 50A to gain electrical access to the interconnect structure 200 of the top tier device 50B.

As discussed above, the implementation of the floating gate 180A does not result in wasted layout area or space. As such, the use of the floating gate 180A (and the corresponding inter-tier via 250 below) to provide electrical interconnections between the metal layers of the top tier device 50B and the microelectronic components of the bottom tier device 50A does not result in increased layout area or space either. In this manner, the present disclosure provides an efficient layout and interconnection scheme using floating gates (or dummy gates) and inter-tier vias.

As another example, an inter-tier via 260 is implemented directly below one of the source/drains 170 in the inverter circuit of the top tier device 50B and directly above one of the metal lines 110 of the bottom tier device 50A. As such, the inter-tier via 260 electrically couples the inverter of the top tier device 50B and the metal line 110 of the bottom tier device 50B together. As shown in FIG. 1B, the metal line 110 located below the inter-tier via 260 is also electrically coupled to the floating gate 80A (through another one of the vias 120). The floating gate 80A is also electrically coupled to the rest of the interconnect structure 100 through another one of the vias 120. Thus, the inter-tier via 260 and the floating gate 80A collectively allow the inverter circuit of the top tier device 50B to gain electrical access to the interconnect structure 100 of the bottom tier device 50A, where the floating gate 80A serves as a conduction layer or conduction element herein.

Figure 2A:
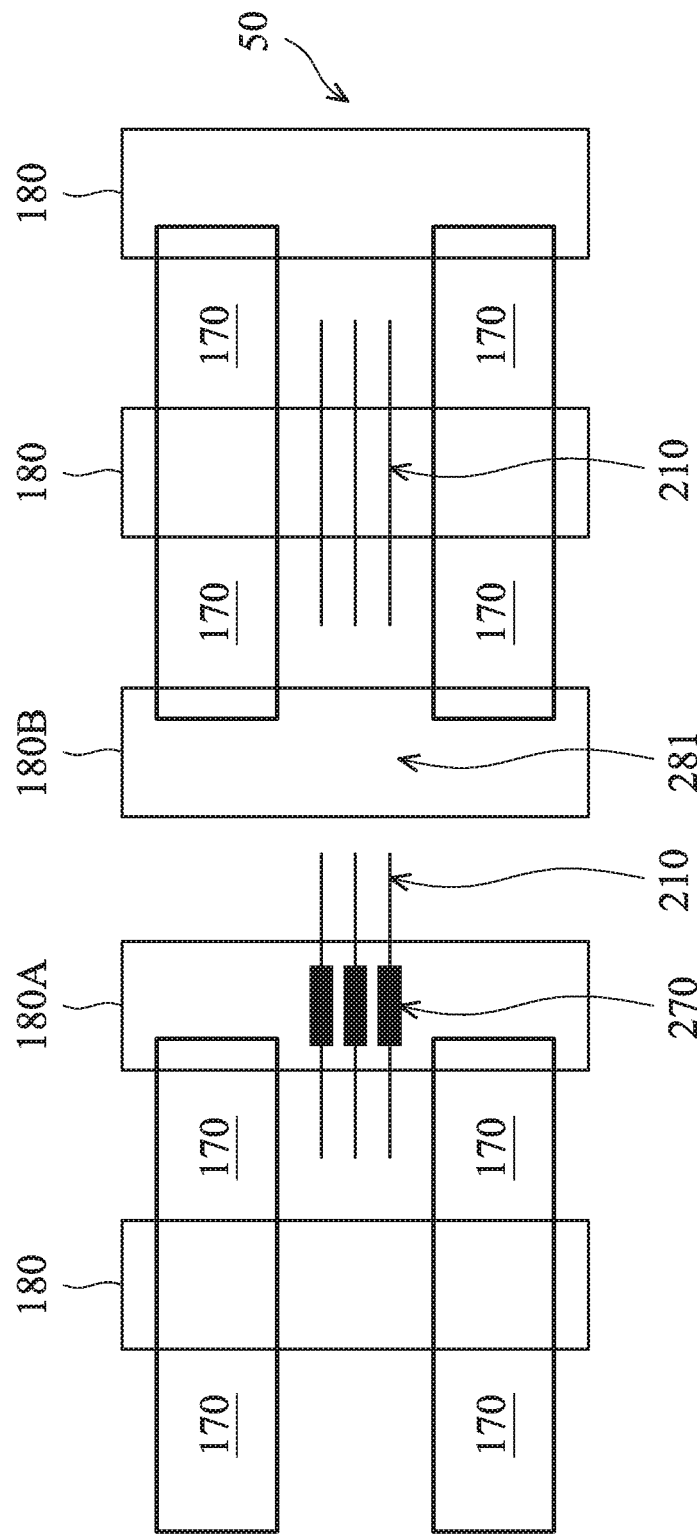
Figure 2B:
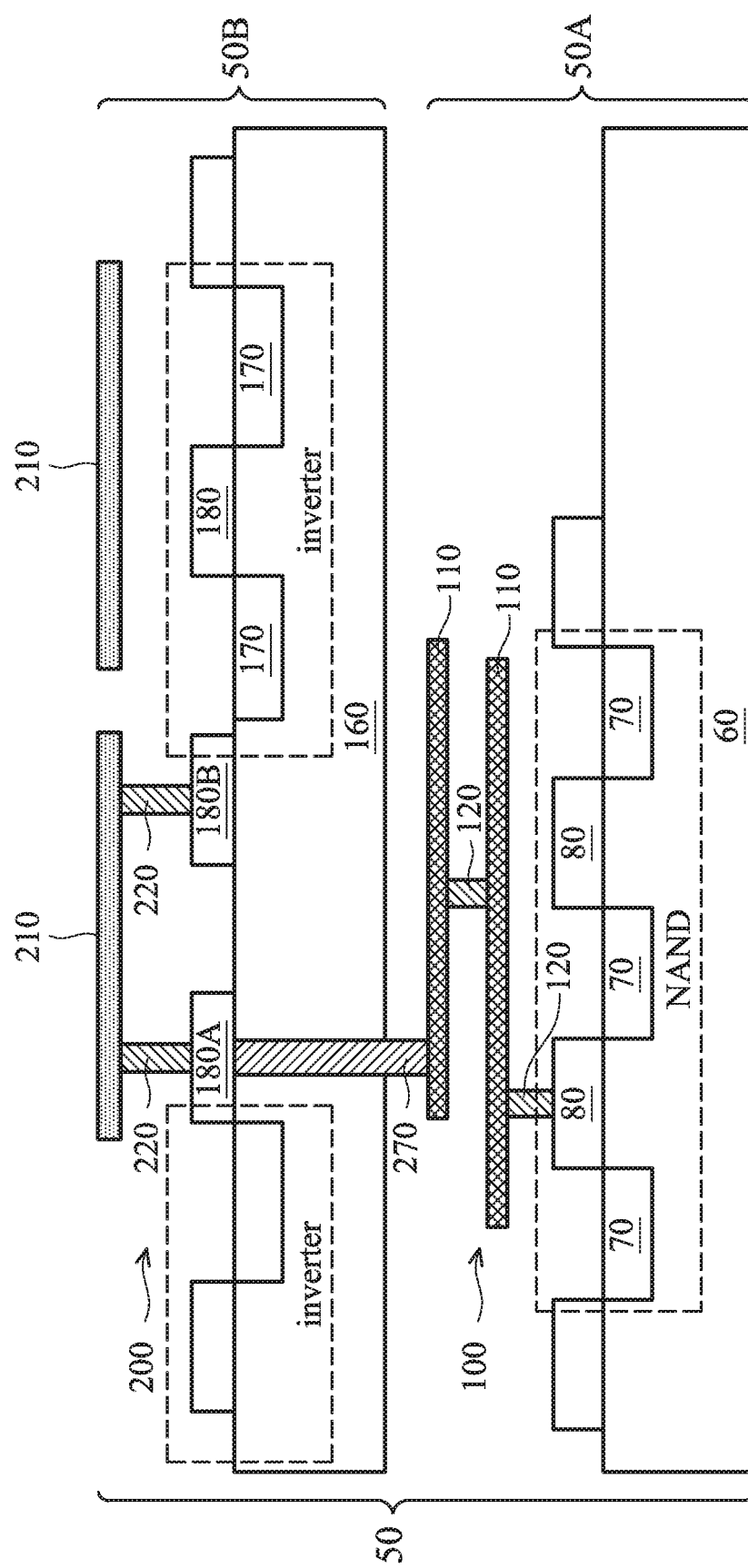
Figure 3A:
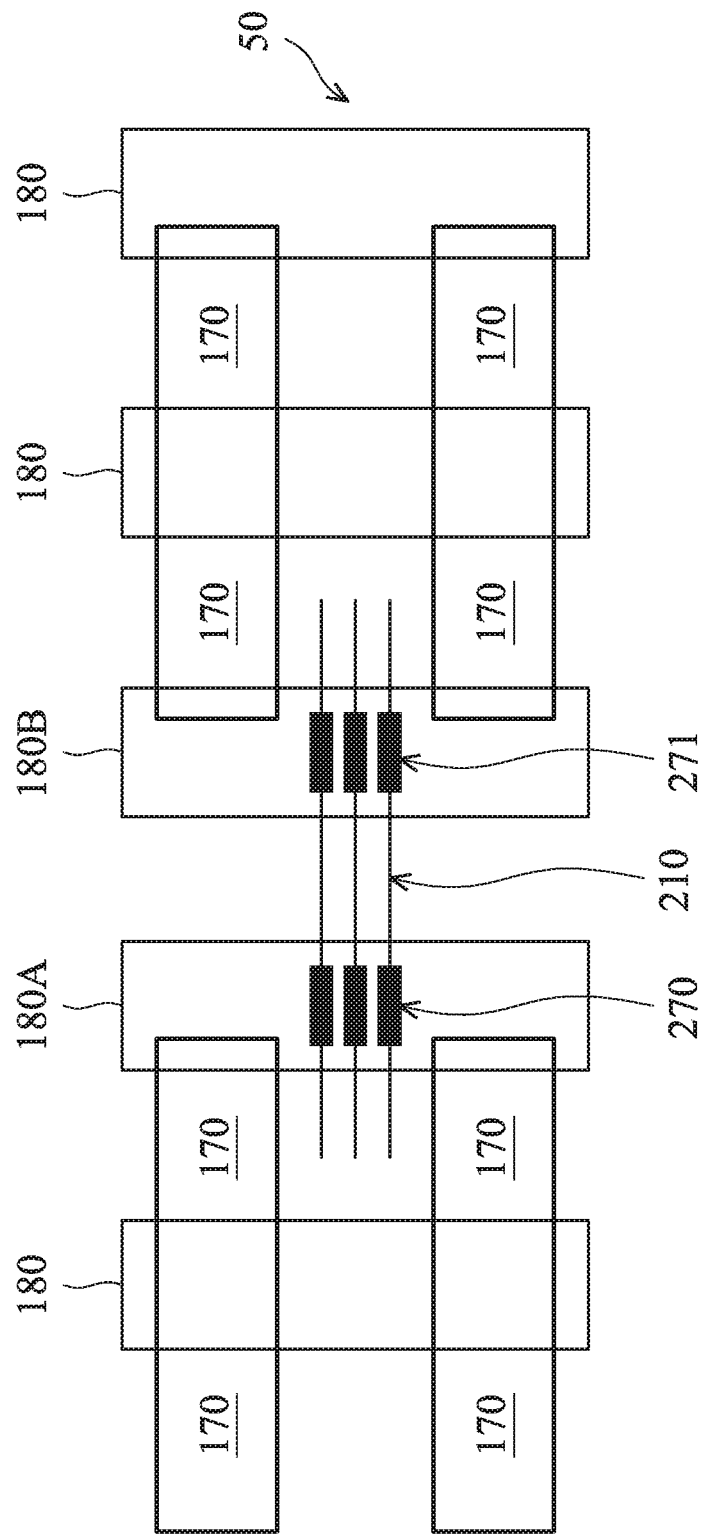
Figure 3B:
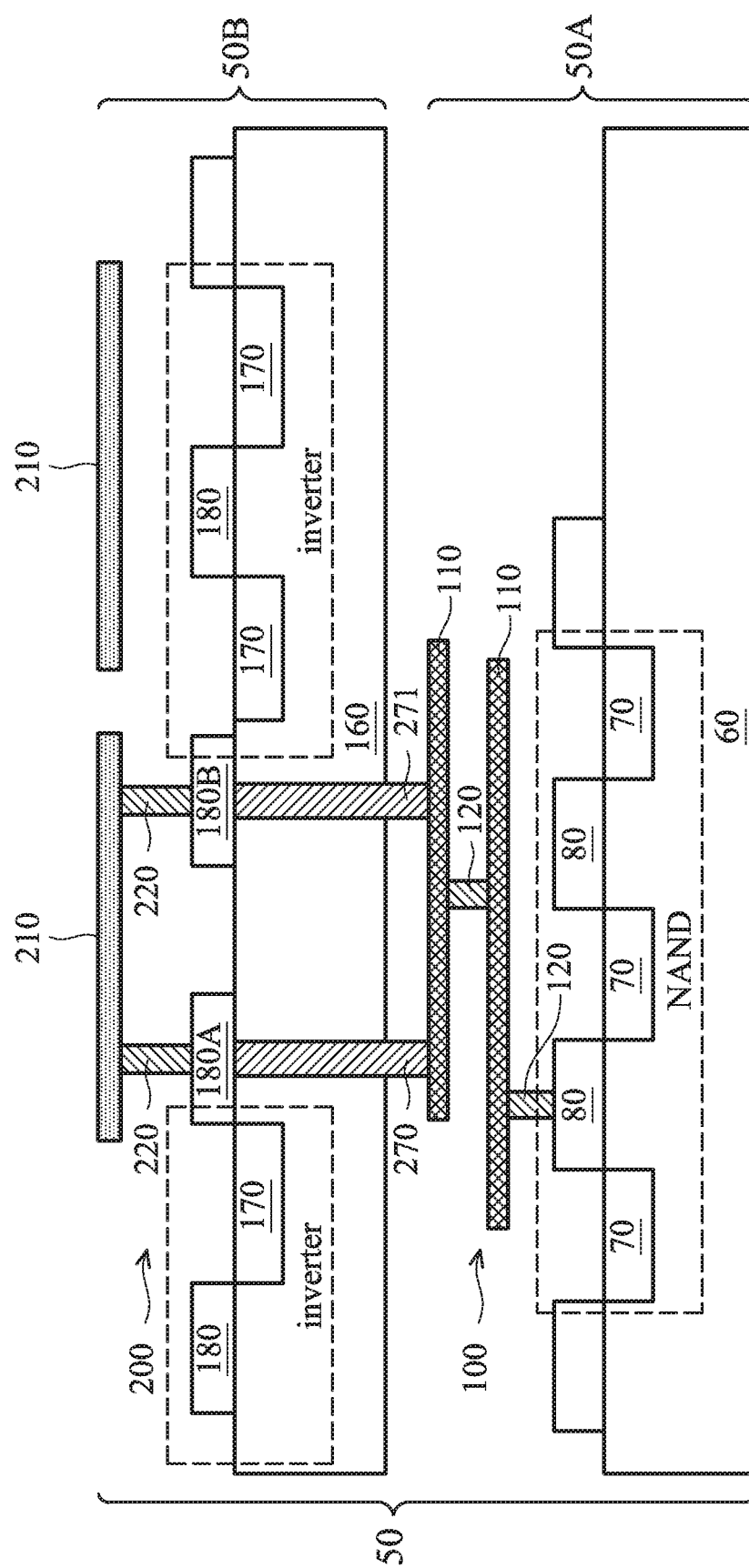

FIGS. 2A-2B provide another example embodiment of the present disclosure involving inter-tier vias. Similar to FIGS. 1A-1B, FIG. 2A is a diagrammatic fragmentary top view of a portion of a 3D-IC device 50, and FIG. 2B is a diagrammatic fragmentary cross-sectional side view of a portion of the 3D-IC device 50. The portion of the 3D-IC device 50 shown in FIG. 2A generally represent the portion of the 3D-IC device 50 shown in FIG. 2B, but it is understood that they may not have an exact one-to-one correspondence for reasons of simplicity. In addition, for reasons of consistency and clarity, similar components in FIGS. 1A-1B are labeled the same in FIGS. 2A-2B.

As shown in FIG. 2B, the top tier device 50B is formed over the bottom tier device 50A. The bottom tier device 50A includes a substrate 60, and the top tier device 50B includes a substrate 160. Source/drains 70 are formed in the substrate 60, and source/drains 170 are formed in the substrate 160. Gates 80 are formed on the substrate 60, and gates 180 are formed on the substrate 160.

On the top tier device 50B, floating gates 180A and 180B are formed between neighboring circuit devices, for example between two inverter circuits (the inverter circuit on the left is only partially illustrated for reasons of simplicity). As discussed above with reference to FIGS. 1A-1B, the floating gates 180A-180B are not connected to VDD or VSS, or are they considered parts of the inverter circuit. In that sense, the floating gates 180A-180B are considered dummy gates. In many situations, one such dummy gate placed between neighboring circuits would be sufficient. However, in some situations, metal line end-to-end violations may become an issue. For example, a via connected to a floating gate may be too close to metal lines over a neighboring circuit device. This may lead to electrical shorting, and therefore extra spacing may be needed between the via and the neighboring metal lines. In the embodiment shown in FIGS. 2A-2B, the floating gate 180B is added as an extra dummy gate to create such extra spacing. As such, the via 220 connected to the floating gate 180A is sufficiently far away from the metal line 210 disposed above the neighboring inverter (to the right).

An inter-tier via 270 is implemented to electrically connect the floating gate 180A from the top tier device 50B and the metal line 110 from the bottom tier device 50A. Similar to the inter-tier via 250 and 260 discussed above with reference to FIGS. 1A-1B, the inter-tier via 270 herein provides electrical access of the interconnect structure 200 of the top tier device 50B to the microelectronic components of the bottom tier device 50A, without wasting extra layout area. In other words, through the inter-tier via 270 and the dummy gate 180A, components from the NAND circuit of the bottom tier device 50A may effectively utilize the routing sources of the interconnect structure 200 of the top tier device 50B.

It is understood that in some embodiments, either one of the floating gates 180A and 180B, or both, may be used to connect to inter-tier vias. For example, referring to FIGS. 3A-3B, which illustrate an embodiment of the 3D-IC 50 similar to the embodiment shown in FIGS. 2A-2B, a second inter-tier via 271 is implemented between the metal line 110 and the floating gate 180B. In this case, the inter-tier via 271 and the floating gate 180B duplicate the functionalities of the inter-tier via 270 and the floating gate 180A, because both inter-tier vias 270 and 271 are electrically connected to the same metal line 110, and because both floating gates 180A and 180B are electrically coupled (through their respective vias) to the same metal line 210. However, in other embodiments, the floating gates 180A and 180B may be electrically coupled to different components (e.g., different metal lines) from the top tier device 50B, and/or the inter-tier vias 270/271 may be electrically coupled to different components (e.g., different metal lines) from the bottom tier device 50A. In these embodiments, the inter-tier via 271 and the floating gate 180B would not merely be duplicating the functionalities of the inter-tier via 270 and the floating gate 180A. Instead, the inter-tier via 271 and the floating gate 180B would be offering different electrical interconnection possibilities for the appropriate components from the bottom tier device 50A and the top tier device 50B.

Figure 4A:
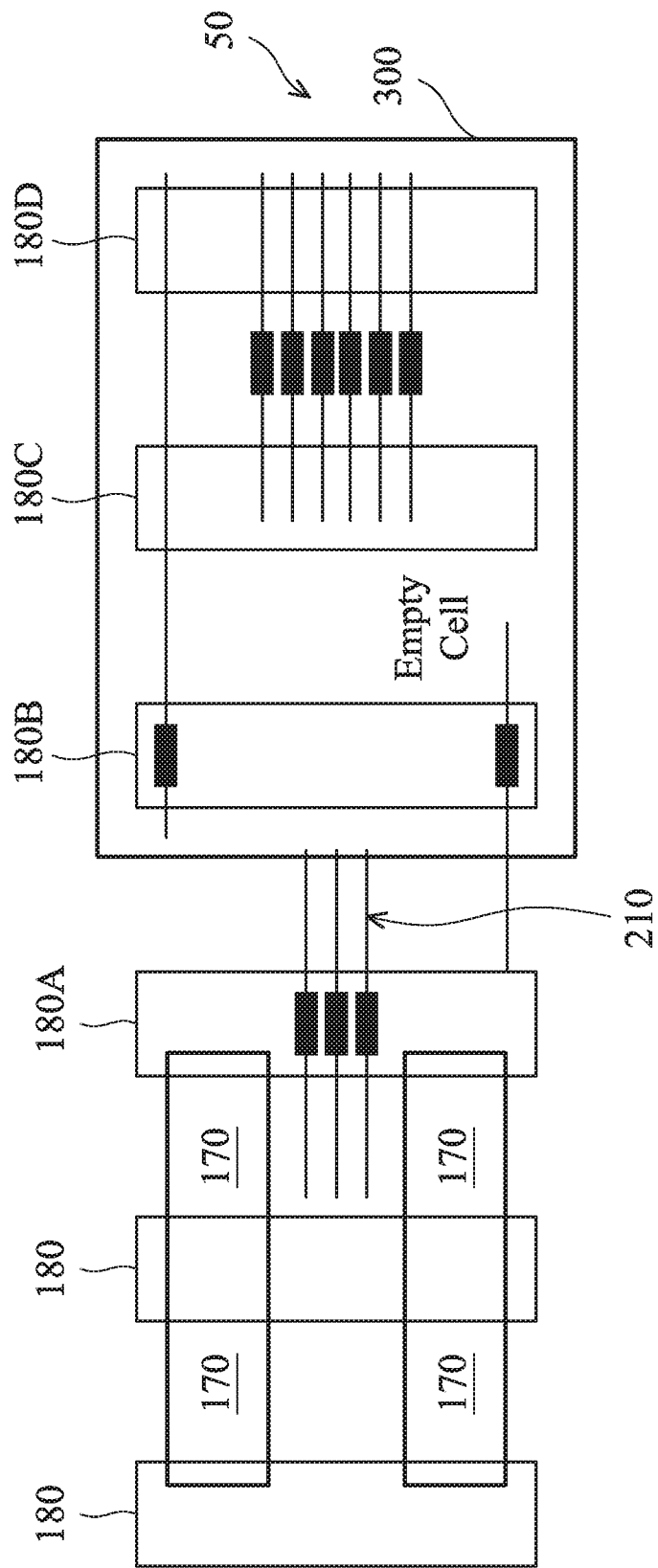
Figure 4B:
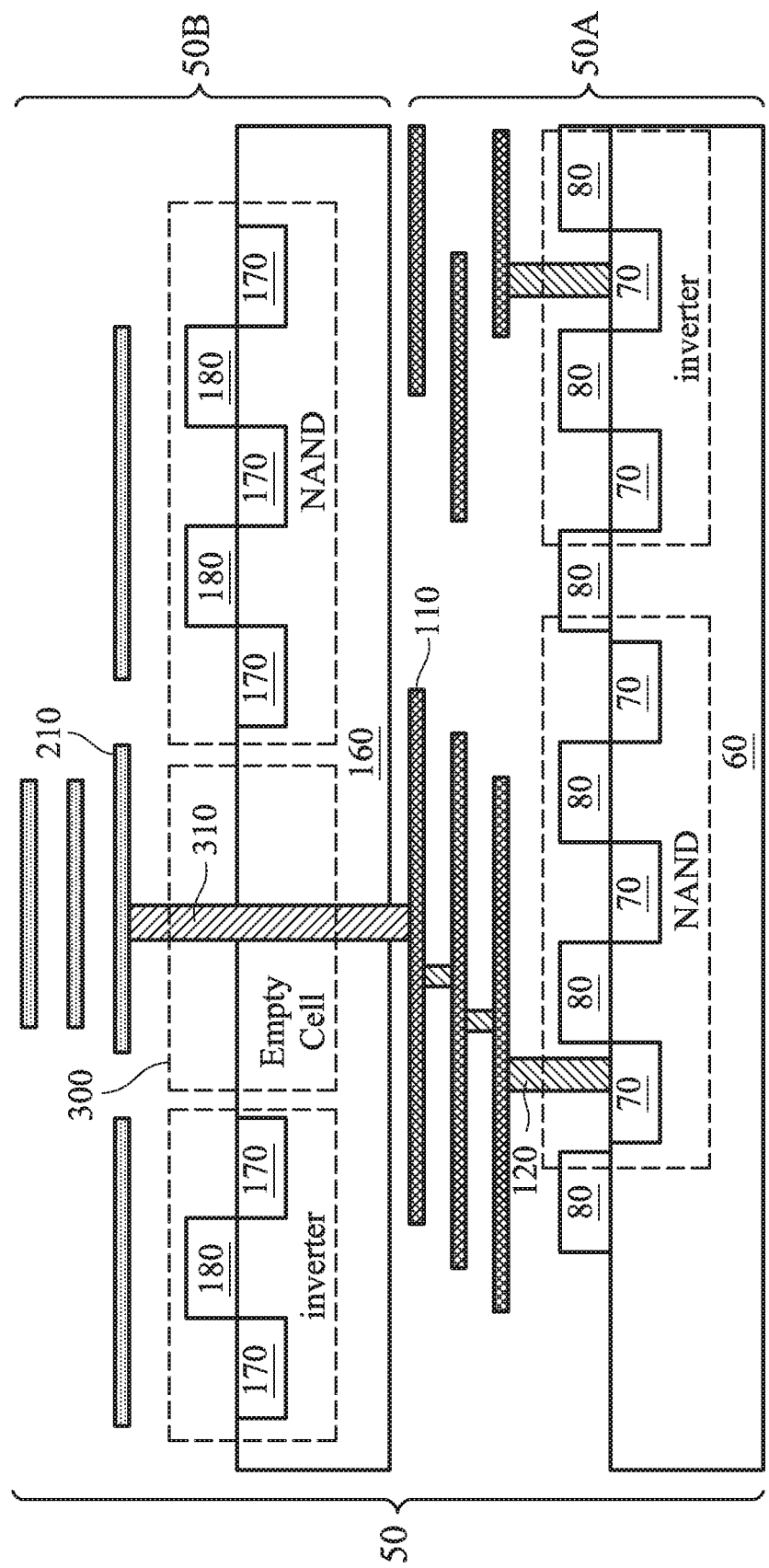

FIGS. 4A-4B provide yet another example embodiment of the present disclosure involving inter-tier vias. Similar to FIGS. 1A-1B, FIG. 4A is a diagrammatic fragmentary top view of a portion of a 3D-IC device 50, and FIG. 4B is a diagrammatic fragmentary cross-sectional side view of a portion of the 3D-IC device 50. The portion of the 3D-IC device 50 shown in FIG. 4A generally represent the portion of the 3D-IC device 50 shown in FIG. 4B, but it is understood that they may not have an exact one-to-one correspondence for reasons of simplicity. In addition, for reasons of consistency and clarity, similar components in FIGS. 1A-1B are labeled the same in FIGS. 4A-4B.

As shown in FIG. 4B, the top tier device 50B is formed over the bottom tier device 50A. The bottom tier device 50A includes a substrate 60, and the top tier device 50B includes a substrate 160. Source/drains 70 are formed in the substrate 60, and source/drains 170 are formed in the substrate 160. Gates 80 are formed on the substrate 60, and gates 180 are formed on the substrate 160.

On the top tier device 50B, a floating gate 180A is formed at the edge of the inverter circuit. In addition, the top tier device 50B includes an empty cell 300. Generally, empty cells (like the empty cell 300 herein) do not contain functional transistors or doped regions. They are typically implemented in areas of the IC where routing is congested, so that these empty cells can provide a clean space for electrical routing. In the embodiment shown in FIG. 4A, the empty cell 300 contains floating gates 180B, 180C, and 180D, which for reasons of simplicity are not illustrated in the cross-sectional view of FIG. 4B (and neither is the floating gate 180A).

An inter-tier via 310 is implemented in the empty cell 300. The inter-tier via 310 electrically connects one of the metal lines 210 from the top tier device 50B to one of the metal line 110, and in turn to the NAND circuit from the bottom tier device 50A. Similar to the inter-tier via 250 and 260 discussed above with reference to FIGS. 1A-1B, the inter-tier via 310 herein provides electrical access of the interconnect structure 200 of the top tier device 50B to the microelectronic components of the bottom tier device 50A, without wasting extra layout area (since the empty cell 300 would have been implemented anyway to reduce routing congestion).

Although not specifically illustrated, it is also understood that the inter-tier via 310 (or additional inter-tier vias) may be connected to any one of the floating gates 180B-180D of the empty cell 300. In addition, through the implementation of the inter-tier via 310, any one of the floating gates 180B-180D may be used as a conduction layer for the metal lines 110 of the bottom tier device 50A.

Figure 5B:
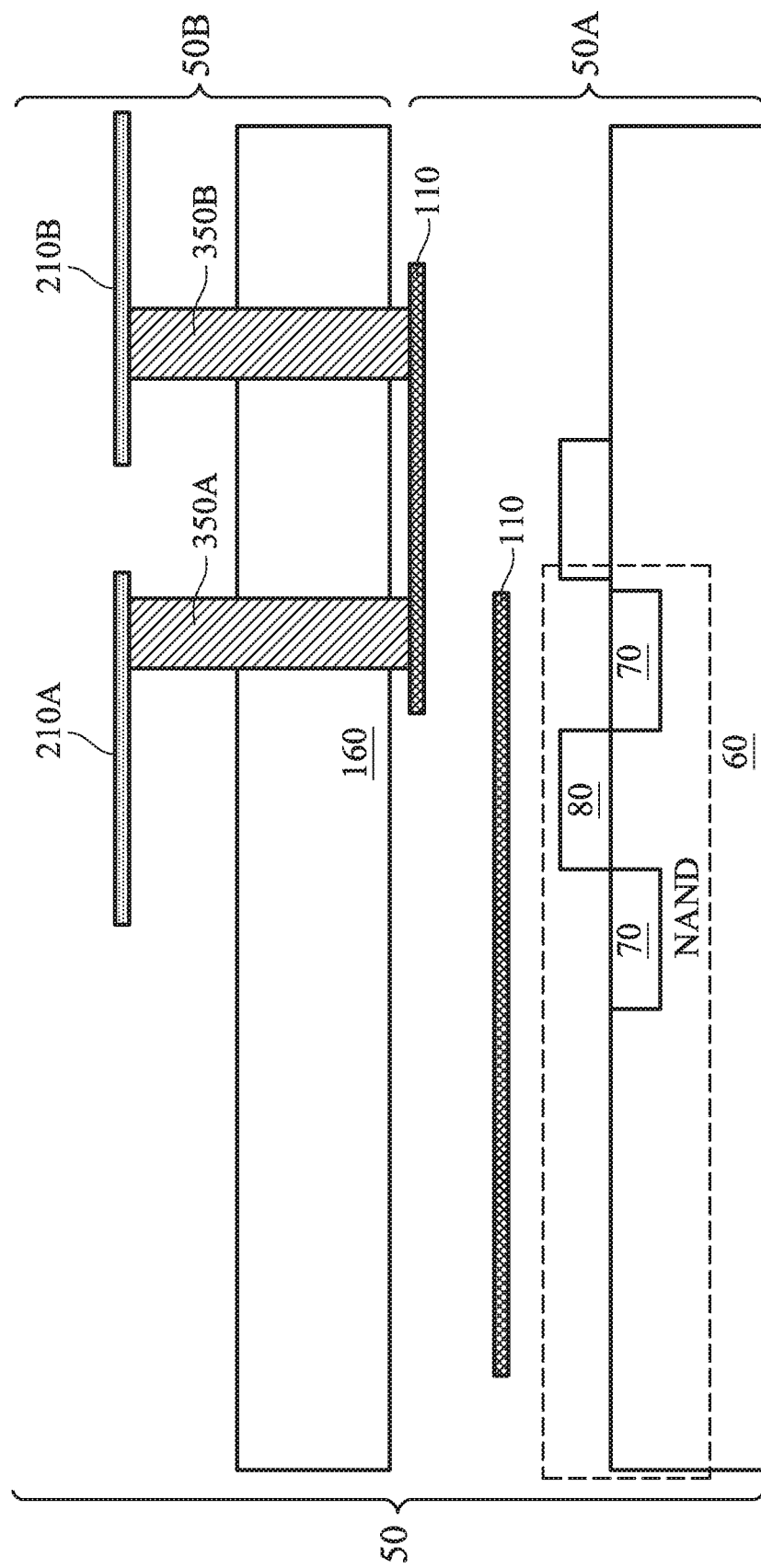

FIGS. 5A and 5B provide further example embodiments of the present disclosure involving inter-tier vias. FIG. 5A is a diagrammatic fragmentary top view of a portion of a 3D-IC device 50, and FIG. 5B is a diagrammatic fragmentary cross-sectional side view of a portion of the 3D-IC device 50. The portion of the 3D-IC device 50 shown in FIG. 5A does not necessarily correspond to the portion of the 3D-IC device 50 shown in FIG. 5B. In other words, FIGS. 5A and 5B may each correspond to a different embodiment of the present disclosure. For reasons of consistency and clarity, however, components such as substrate, source/drains, gates, etc. that appear in the previous FIGS. 1A-1B to 4A-4B are labeled the same in FIGS. 5A-5B.

According to the embodiment shown in FIG. 5A, a floating gate 180A may be electrically connected to an inter-tier via 320. The inter-tier via 320 is also electrically connected to a metal line 330, which runs along the length of the elongated floating gate 180A. In other words, whereas the rest of the metal line 210 in FIG. 5A run along a first axis (e.g., horizontally in FIG. 5A), the metal line 330 connected to the inter-tier via 320 run along a second axis (e.g., vertically in FIG. 5A) perpendicular to the first axis. This type of 2-dimensional metal scheme can resolve metal-0 minimum area issues or line-to-line spacing issues.

Referring now to the embodiment shown in FIG. 5B, two example inter-tier vias 350A and 350B are implemented. The inter-tier via 350A is electrically connected to a metal line 210A of the top tier device 50B and a metal line 110 of the bottom tier device 50A. The inter-tier via 350B is electrically connected to a metal line 210B of the top tier device 50B and the metal line 110 of the bottom tier device 50A. In this manner, the metal lines 210A and 210B of the top tier device 50B are electrically connected together. The inter-tier vias 350A and 350B serve as electrically conductive bridges herein. The configuration described above with reference to FIG. 5B is helpful when the routing has become congested for the top tier device 50B. By using the inter-tier vias 350A and 350B as bridges to the metal lines in the bottom tier device 50A, the top tier device 50B effectively gain access to the routing resources of the bottom tier device 50A. For example, if the top tier device 50B and the bottom tier device 50A each have 8 metal layers, then with the configuration shown in FIG. 5B, the top tier can effectively utilize 16 metal layers (i.e., the sum of 8+8) for routing.

The approach discussed above with reference to FIG. 5B may also be used to allow the bottom tier device 50A to take advantage of the routing resources of the top tier device 50B as well. For example, the inter-tier vias 350A and 350B may be connected to the same metal line in the top tier device 50B but may be connected to different metal lines in the bottom tier device 50A, in which case the metal lines of the bottom tier device are electrically coupled together using the inter-tier vias 350A/350B as bridges. For reasons of simplicity, this embodiment is not specifically illustrated herein.

Figure 6A:
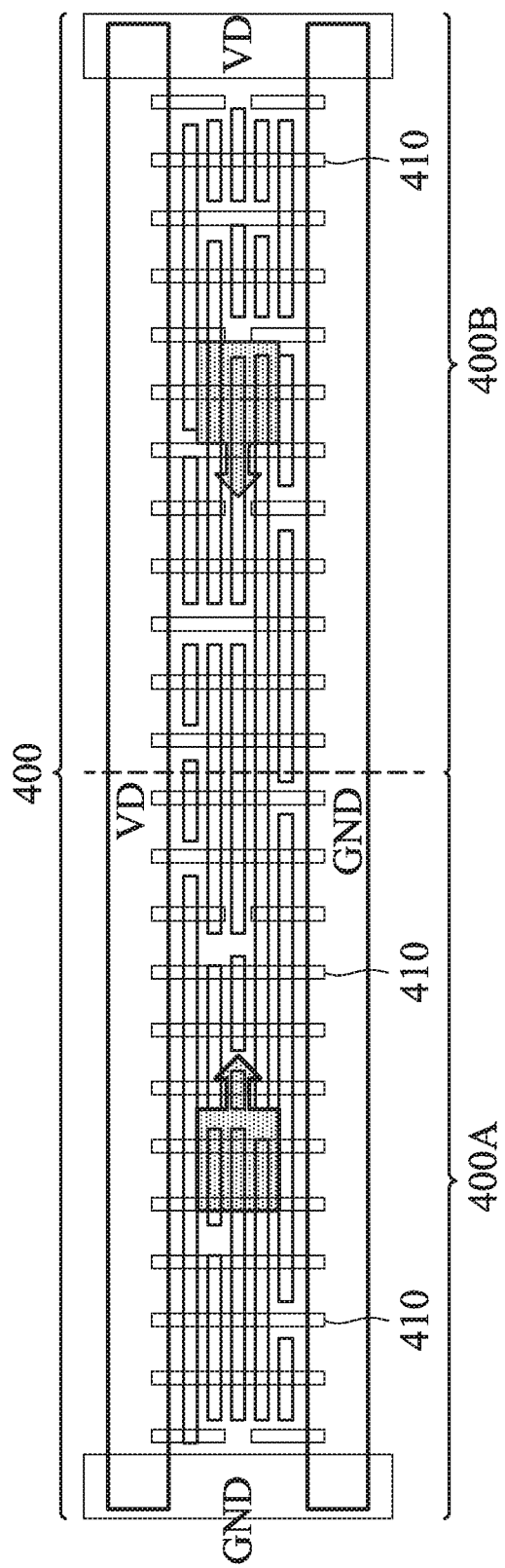
FIGS. 6A-6B and 7A-7C are diagrammatic fragmentary top views illustrating a decomposition of a circuit cell into separate portions located on different tiers of a 3D-IC in accordance with some embodiments of the present disclosure.
Figure 6B:
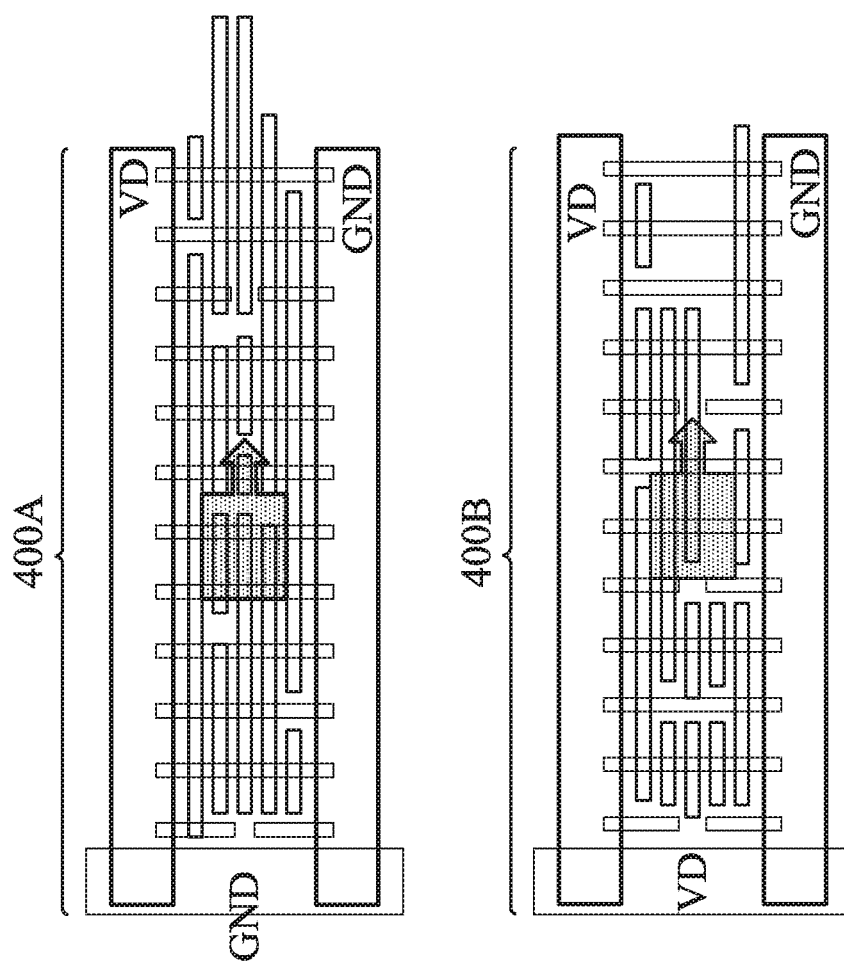

FIGS. 6A and 6B provide yet another example embodiment of the present disclosure involving the use of inter-tier vias to break down large cells. In more detail, FIG. 6A is a diagrammatic fragmentary top view of a "large cell" 400. A large cell may refer to a cell or a circuit that consumes relatively a large amount of IC area and/or includes many transistors. For example, the large cell 400 shown in FIG. 6A contains a plurality of gates 410 (only some of which are labeled). The large cell 400 also includes rails VD (an example power rail) and GND (ground rail). Since the large cell 400 consumes more chip area, it needs more Electromigration margin and is more sensitive to power/ground IR drop. Enlarging the VD/GND rail width would increase cell height and degrade gate density.

To overcome these problems, the large cell 400 is split into two separate segments 400A and 400B according to the various aspects of the present disclosure. FIG. 6B is a diagrammatic fragmentary top view of the "large cell" being broken down to two separate pieces 400A and 400B. The piece 400A corresponds to a "left" portion of the large cell 400, and the piece 400B corresponds to a "right" portion of the large cell 400. The pieces 400A and 400B are split by approximately "cutting" the large cell across its middle, represented by the dashed lines in FIG. 6A. The piece 400A is implemented on a top tier device of a 3D-IC, while the piece 400B is "folded" 180 degrees and then implemented on a bottom tier of the 3D-IC, where the top tier device is formed over the bottom tier device vertically. The pieces 400A and 400B implemented on top and bottom tiers of the 3D-IC device are electrically interconnected together by inter-tier vias similar to those discussed above with reference to FIGS. 1A-1B to FIGS. 5A-5B.

By splitting the large cell 400 into two separate pieces that are implemented on top and bottom tiers of a 3D-IC, the Electromigration margin can be relaxed. It also reduces the power/ground rail average current and gains two times the total power/ground width. This is because the top tier (on which the piece 400A is implemented) has its own power/ground rails VD and GND, and the bottom tier (on which the piece 400B is implemented) also has its own power/ground rails VD and GND. In other words, power and ground rails are both doubled. This is also done without increasing density or affecting chip layout, since the same large cell 400 is effectively reconstructed in a three-dimensional manner by stacking the pieces 400A and 400B vertically on the 3D-IC.

Figure 7A:
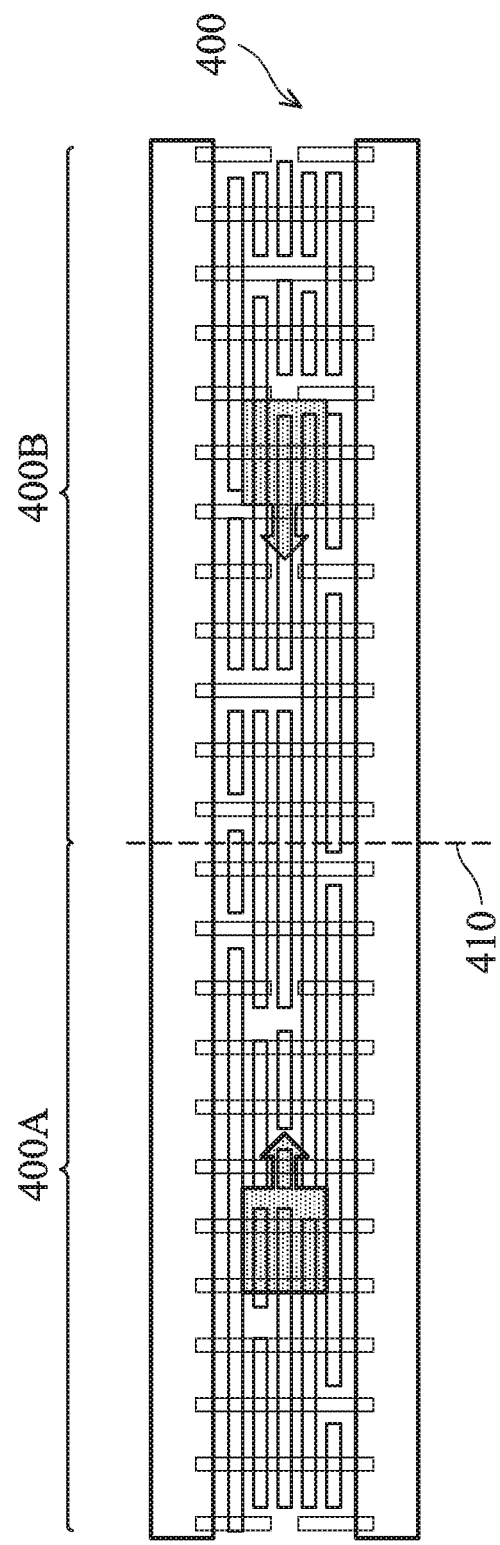
Figure 7B:
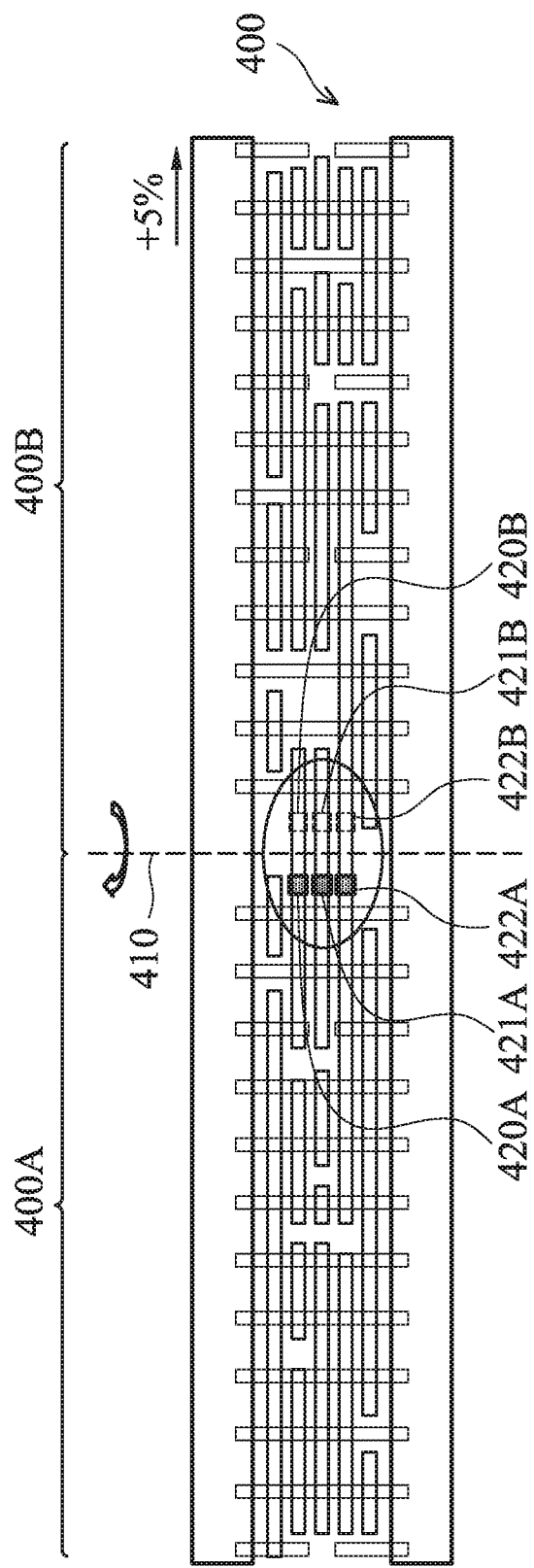
Figure 7C:
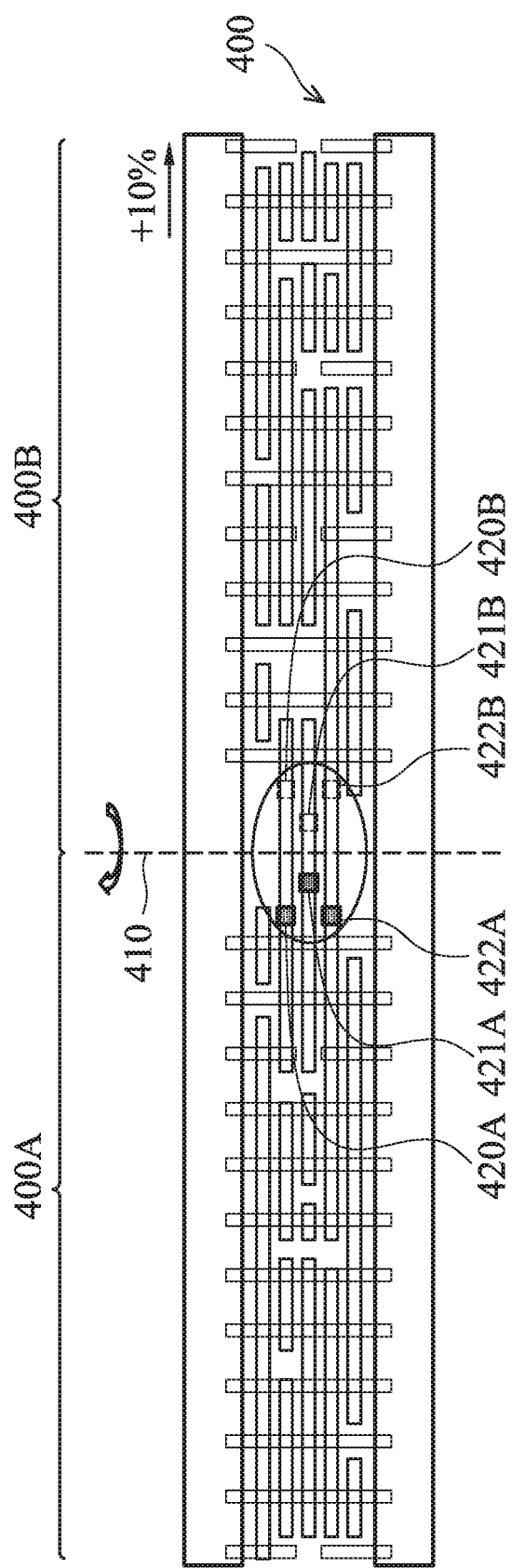

FIGS. 7A-7C are diagrammatic fragmentary top views of the "large cell" 400 being split or decomposed according to different embodiments of the present disclosure. As shown in FIG. 7A, the large cell 400 (containing 20 gates) is split substantially evenly along its middle (represented by the dashed "cutline" 410 in FIG. 7B, which also appears in FIGS. 7B-7C), and thus the left portion 400A and the right portion 400B each correspond to about 50% of the area of the total cell 400. This may be referred to as a decomposition process. It is understood that the decomposition process illustrated herein splits the large cell 400 substantially evenly across its middle, the cell may be split in other ways in alternative embodiments, for example a 40%/60% split, or a 55%/45% split. In some embodiments, the decomposition may be performed such that the "cutline" 410 is positioned at areas of the cell that is outside of circuits or microelectronic components that have important functionalities, so as to minimize any potential risks associated with the decomposition.

After being decomposed, the inter-tier vias need to be placed near the edges of the decomposed portions 400A and 400B, which may first involving "stretching" the cell 400 to make room for the inter-tier vias. In the embodiment shown in FIG. 7B, the large cell 400 is artificially "stretched" horizontally by one pitch. Since the large cell 400 contains 20 gates in this example, stretching the cell 400 by one pitch enlarges the total area of the cell by about 5%, which is not substantial.

Still referring to FIG. 7B, inter-tier vias 420A, 421A, and 422A are placed on the right edge of the decomposed portion 400A, and inter-tier vias 420B, 421B, and 422B are placed on the left edge of the decomposed portion 400B. The inter-tier vias 420A and 420B are disposed substantially symmetrically on either side of the "cutline" 410, the inter-tier vias 421A and 421B are disposed substantially symmetrically on either side of the "cutline" 410, and inter-tier vias 422A and 422B are disposed substantially symmetrically on either side of the "cutline" 410. This is so that when the decomposed cell portions 400A and 400B are implemented on the different tiers of the 3D-IC, the inter-tier via 420A will vertically align with the inter-tier via 420B, the inter-tier via 421A will vertically align with the inter-tier via 421B, and the inter-tier via 422A will vertically align with the inter-tier via 422B. In other words, when the cell 400 "folded" around the "cutline" 410, the inter-tier vias 420B-422B will be vertically aligned with the inter-tier vias 420A-422A. The inter-tier via 420B-422B are aligned with the inter-tier vias 420A-422A so as to establish electrical interconnections between the decomposed cell portions 400A and 400B. Thus, it is understood that the inter-tier vias 420A and 420B are actually the same inter-tier via, the inter-tier vias 421A and 410B are actually the same inter-tier via, and the inter-tier vias 422A and 422B are actually the same inter-tier via, even though they are being illustrated separately on the top views herein.

In the embodiment shown in FIG. 7C, the large cell 400 is artificially "stretched" horizontally by two pitches. Since the large cell 400 contains 20 gates in this example, stretching the cell 400 by two pitches enlarges the total area of the cell by about 10%, which is still not substantial. The reason that the embodiment shown in FIG. 7C stretches the cell 400 by two pitches is to avoid potential layout rule violations due to close proximity of inter-tier vias, as discussed below.

Still referring to FIG. 7C, inter-tier vias 420A, 421A, and 422A are placed on the right edge of the decomposed portion 400A, and inter-tier vias 420B, 421B, and 422B are placed on the left edge of the decomposed portion 400B. The inter-tier vias 420A and 420B are disposed substantially symmetrically on either side of the "cutline" 410, the inter-tier vias 421A and 421B are disposed substantially symmetrically on either side of the "cutline" 410, and inter-tier vias 422A and 422B are disposed substantially symmetrically on either side of the "cutline" 410. Again, this is done so that when the decomposed cell portions 400A and 400B are implemented on the different tiers of the 3D-IC, the inter-tier via 420A will vertically align with the inter-tier via 420B, the inter-tier via 421A will vertically align with the inter-tier via 421B, and the inter-tier via 422A will vertically align with the inter-tier via 422B, so as to establish electrical interconnections between the decomposed cell portions 400A and 400B. Again, it is understood that the inter-tier vias 420A and 420B are actually the same inter-tier via, the inter-tier vias 421A and 421B are actually the same inter-tier via, and the inter-tier vias 422A and 422B are actually the same inter-tier via, even though they are being illustrated separately on the top views herein.

Unlike the embodiment shown in FIG. 7B, the inter-tier vias 421A and 421B in the embodiment shown in FIG. 7C are horizontally offset from the inter-tier vias 420A/422A and 420B/422B, respectively. In other words, the inter-tier vias 420A-422A have a staggered formation, as do the inter-tier vias 420B-422B. The horizontal offset between the inter-tier vias 420A-422A (and between the inter-tier vias 420B-422B) allows the inter-tier via 421A to be spaced farther apart from the inter-tier vias 420A/422A, and allows the inter-tier via 421B to be spaced farther apart from the inter-tier vias 420B/422B. The increased spacing between the inter-tier vias avoids potential layout rule violations. In other words, the additional layout area increase (from 5% to 10%), while a penalty, is done to ensure there are no layout rule violations. This may be a worthwhile tradeoff in many situations.

Figure 8A:
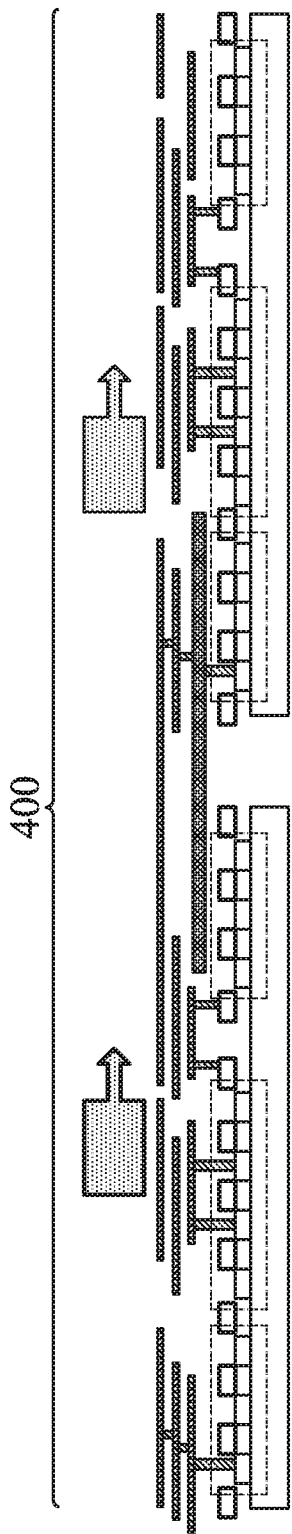
FIGS. 8A-8B are diagrammatic fragmentary cross-sectional side views illustrating a decomposition of a circuit cell into separate portions located on different tiers of a 3D-IC in accordance with some embodiments of the present disclosure.

Referring now to FIGS. 8A and 8B, FIG. 8A is a diagrammatic fragmentary cross-sectional side view of the large cell 400 discussed above with reference to FIG. 6A or 7A, and FIG. 8B is diagrammatic fragmentary cross-sectional side view of the decomposed portions 400A and 400B of the cell 400. The decomposed portion 400A of the cell is implemented on a top tier device 50B of a 3D-IC, and the decomposed portion 400B of the cell is implemented on a bottom tier device 50A of a 3D-IC. The arrows shown in FIGS. 8A and 8B help illustrate the directionality of the "flipping" (as a part of the decomposition of the cell 400)

process. In other words, the arrows herein indicate how the cell portions 400A and 400B are oriented before and after the flipping.

Figure 8B:
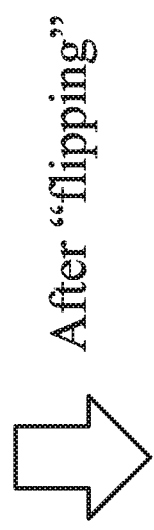
Figure 8B:
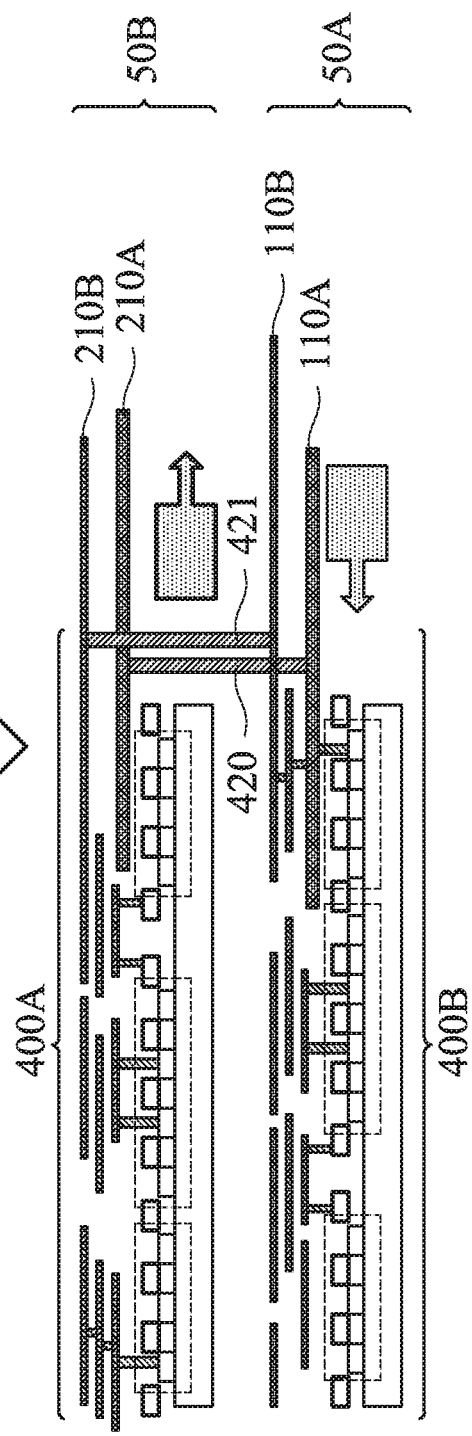

As illustrated in FIG. 8B, inter-tier vias 420 and 421 are implemented to electrically interconnect the cell portions 400A and 400B. As discussed above, the inter-tier via 420 is illustrated as inter-tier vias 420A and 420B in FIGS. 7B-7C, and the inter-tier via 421 is illustrated as inter-tier vias 421A and 421B in FIGS. 7B-7C. The inter-tier vias 420A and 420B are vertically aligned because they are really the same inter-tier via 420, and the inter-tier vias 421A and 421B are vertically aligned because they are really the same inter-tier via 421. The inter-tier via 422 is not illustrated herein for reasons of simplicity.

As shown in FIG. 8B, the top end of the inter-tier via 420 is directly connected to one of the metal lines 210A of the top tier device 50B, and the bottom end of the inter-tier via 420 is directly connected to one of the metal lines 110A of the bottom tier device 50A. The top end of the inter-tier via 421 is directly connected to one of the metal lines 210B of the top tier device 50B, and the bottom end of the inter-tier via 420 is directly connected to one of the metal lines 110B of the bottom tier device 50A. Through these connections, the decomposed cell portions 400A and 400B are still electrically interconnected together in the same manner as the cell 400 is in FIG. 8A. Therefore, the decomposition of the cell 400 does not interfere with the functionality of the cell 400, while offering benefits such as relaxed Electromigration margin and reduced power/ground rail average current, etc.

Figure 9A:
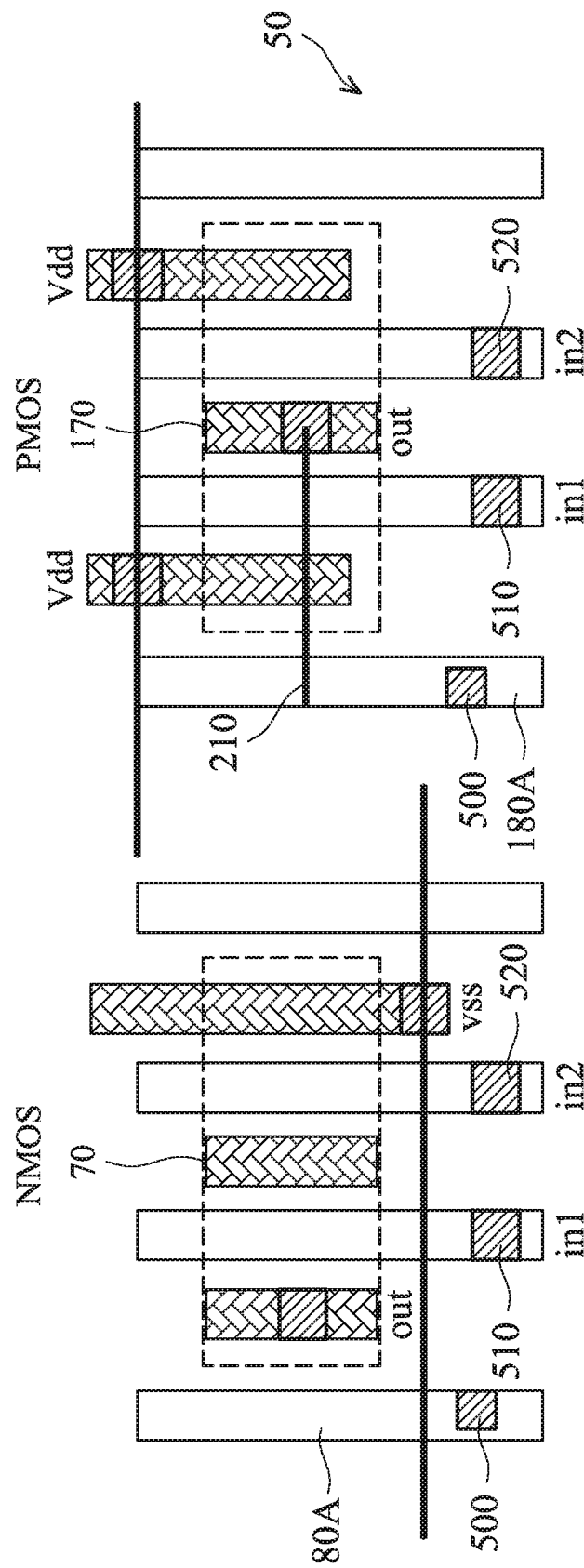
FIGS. 9A-9B are diagrammatic fragmentary top view and cross-sectional side view illustrating a PMOS and an NMOS implemented on different tiers of a 3D-IC in accordance with some embodiments of the present disclosure.
Figure 9B:
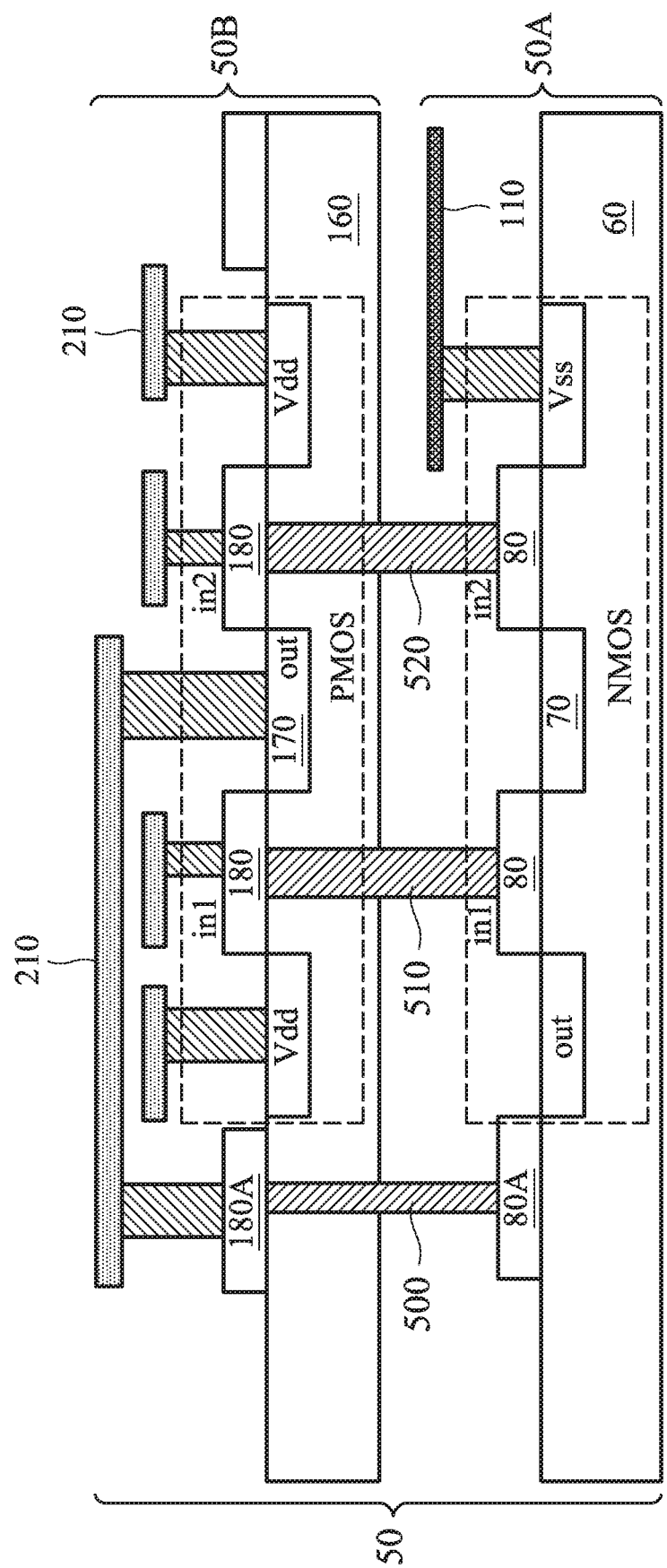
Figure 10:
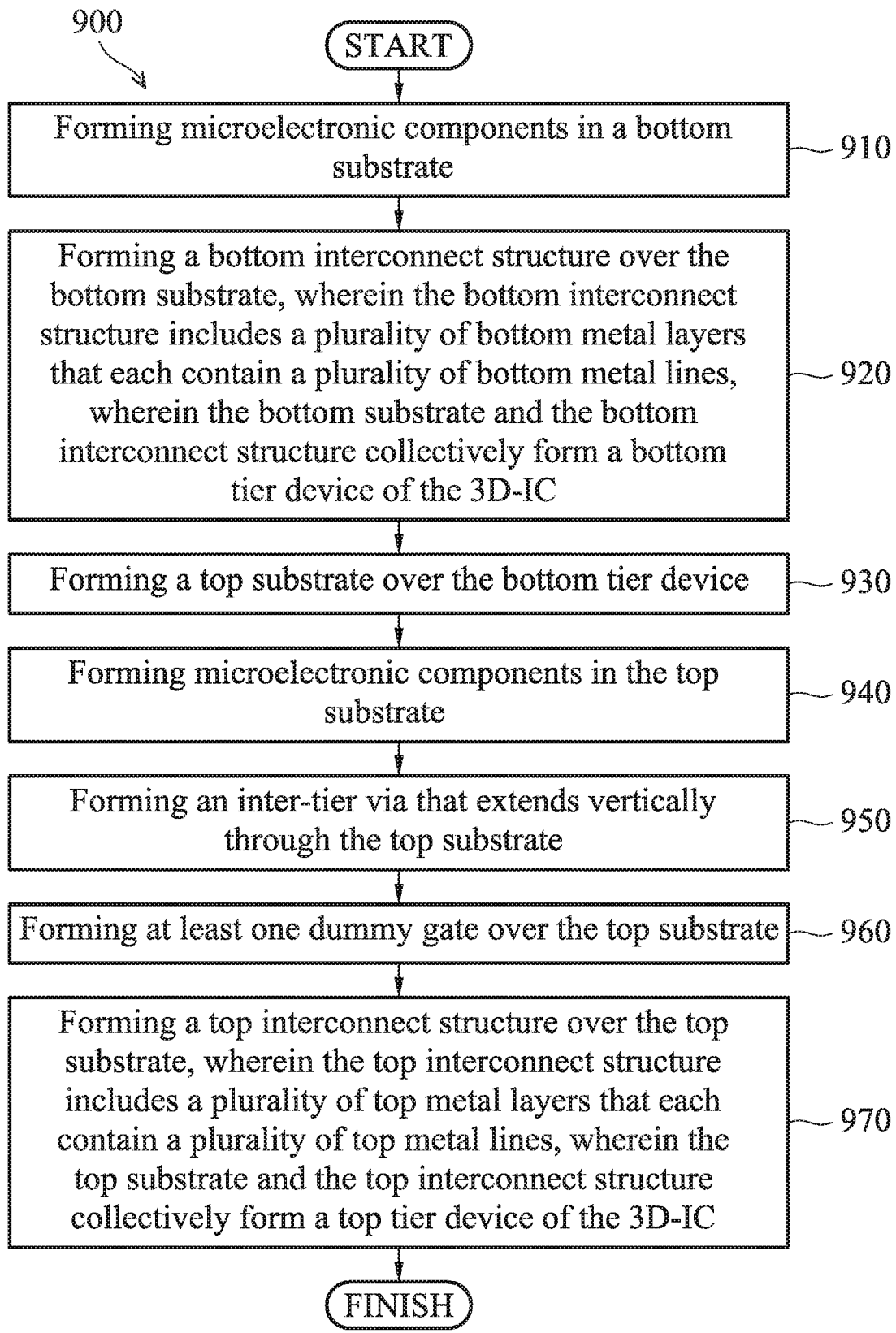
FIG. 10 is a flowchart illustrating a method of fabricating a 3D-IC device in accordance with some embodiments of the present disclosure.

FIGS. 9A-9B illustrate yet another example embodiment of the present disclosure involving inter-tier vias. Similar to FIGS. 1A-1B, FIG. 9A is a diagrammatic fragmentary top view of a portion of a 3D-IC device 50, and FIG. 9B is a diagrammatic fragmentary cross-sectional side view of a portion of the 3D-IC device 50. The portion of the 3D-IC device 50 shown in FIG. 9A generally represent the portion of the 3D-IC device 50 shown in FIG. 9B, but it is understood that they may not have an exact one-to-one correspondence for reasons of simplicity.

In more detail, the portion of the 3D-IC device 50 includes a circuit cell that includes a p-type transistor, which is a PMOS in this embodiment, and an n-channel transistor, which is an NMOS in this case. The PMOS is implemented on the top tier device 50B, while the NMOS is implemented on the bottom tier device 50A, or vice versa. The approximate outlines of the PMOS and the NMOS are illustrated as broken lines in FIGS. 9A and 9B. Also, the top view of the NMOS and PMOS are both illustrated in FIG. 9A for additional clarity, even though the NMOS would not be directly visible since it would be blocked by the PMOS.

Doped regions such as source/drains 70 are formed in a substrate 60 of the bottom tier device 50A, and doped regions such as source/drains 170 are formed in a substrate 160 of the top tier device 50B. During operation, some of these source/drains are tied to Vdd, Vss, or out, etc., and they are labeled as such in FIGS. 9A-9B. Gates 80 and 180 are also formed over the substrates 60 and 160, respectively. During operation, some of these gates are being used as inputs, and they are labeled as in1 and in2 in FIGS. 9A-9B.

At least one of the gates 80 is a dummy gate 80A, and at least one of the gates 180 is a dummy gate 180A, for example similar to the floating gate 180A discussed above with reference to FIGS. 1-5. Metal lines such as metal line 110 are formed as a part of an interconnect structure over the substrate 60 in the bottom tier device 50A, and metal lines such as metal line 210 are formed as a part of an interconnect structure over the substrate 160 in the bottom tier device 50B.

Inter-tier vias 500, 510, and 520 are implemented to electrically interconnect the PMOS from the top tier device 50B to the NMOS from the bottom tier device 50A. In more detail, a top end of the inter-tier via 500 is directly connected to the dummy gate 180A, and a bottom end of the inter-tier via 500 is directly connected to the dummy gate 80A. A top end of the inter-tier via 510 is directly connected to the gate 180 (in1) of the PMOS, and a bottom end of the inter-tier via 510 is directly connected to the gate 80 (in1) of the NMOS. A top end of the inter-tier via 520 is directly connected to the gate 180 (in2) of the PMOS, and a bottom end of the inter-tier via 510 is directly connected to the gate 80 (in2) of the NMOS. It is understood that although the embodiment in FIGS. 9A-9B show the PMOS being stacked on the NMOS, the reverse may be true in alternative embodiments, meaning that an NMOS may be stacked on the PMOS in those embodiments.

By stacking the PMOS and the NMOS of a circuit cell vertically on the top and bottom tier devices of the 3D-IC, an area reduction of almost 50% can be achieved compared to conventional 2D layout schemes of the circuit cell with the PMOS and NMOS. Using dummy gates and inter-tier vias to electrically interconnect the PMOS and NMOS also offers electrical routing simplicity and efficiency.

FIG. 9 is a flowchart of a method 900 of fabricating a 3D-IC device according to various aspects of the present disclosure. The method 900 includes a step 910 of forming microelectronic components in a bottom substrate.

The method 900 includes a step 920 of forming a bottom interconnect structure over the bottom substrate. The bottom interconnect structure includes a plurality of bottom metal layers that each contain a plurality of bottom metal lines. The bottom substrate and the bottom interconnect structure collectively form a bottom tier device of the 3D-IC.

The method 900 includes a step 930 of forming a top substrate over the bottom tier device.

The method 900 includes a step 940 of forming microelectronic components in the top substrate.

The method 900 includes a step 950 of forming an inter-tier via that extends vertically through the top substrate.

The method 900 includes a step 960 of forming at least one dummy gate over the top substrate.

The method 900 includes a step 970 of forming a top interconnect structure over the top substrate. The top interconnect structure includes a plurality of top metal layers that each contain a plurality of top metal lines. The top substrate and the top interconnect structure collectively form a top tier device of the 3D-IC.

The inter-tier via is formed to electrically couple together the bottom tier device and at least one of: the microelectronic components formed in the top substrate, the at least one dummy gate, or the top interconnect structure.

In some embodiments, the forming of the microelectronic components in the top substrate comprises forming a plurality of circuit cells, and the forming of the at least one dummy gate is performed such that the at least one dummy gate is formed between two neighboring circuit cells. The dummy gate is not a functional part of any of the circuit cells.

In some embodiments, the forming of the microelectronic components in the bottom substrate comprises forming microelectronic components of a first type of transistor in the bottom substrate, and the forming of the microelectronic components in the top substrate comprises forming microelectronic components of a second type of transistor in the bottom substrate. The first and second types of transistors are opposite types. The inter-tier via is formed so as to electrically couple together the first type of transistor and the second type of transistor.

In some embodiments, the method 900 further comprises a step of decomposing a circuit cell into a first segment and a second segment. The first segment of the decomposed circuit cell is implemented in the bottom tier device. The second segment of the decomposed circuit cell is implemented in the top tier device. The first segment and the second segment are electrically interconnected together at least in part using the inter-tier via.

It is understood that additional processes may be performed before, during, or after the steps 910-970 of the method 900 to complete the fabrication of the 3D-IC device. For reasons of simplicity, these additional fabrication steps are not discussed herein in detail.

Based on the above discussions, it can be seen that the present disclosure offers advantages over conventional methods and devices of low-k dielectric material fabrication. It is understood, however, that other embodiments may offer additional advantages, and not all advantages are necessarily disclosed herein, and that no particular advantage is required for all embodiments. One advantage is that the monolithic 3D integration with two stacked devices can achieve substantial area reduction. By using the inter-tier vias and dummy gates to connect the top and bottom tier devices, no additional layout area is wasted. Inter-tier vias also allows for better utilization of routing resources. For example, by using one or more inter-tier vias, the routing resources (e.g., the metal layers) of a top tier device may be provided to a bottom tier device, or vice versa. In other cases, inter-tier vias and dummy gates can also be used effectively as conduction layers or bridges for enhanced routing flexibility. Another advantage is that large circuit cells may be decomposed into separate cell portions, which may then be implemented on the top and bottom tiers of a 3D-IC. This scheme offers improved Electromigration margin and reduced sensitivity to power/ground IR drop. Yet another advantage is that the p-type and n-type transistors of a circuit can be implemented on the top and bottom tier devices of a 3D-IC, respectively. This approach also offers layout area reduction and routing simplicity.

One aspect of the present disclosure pertains to a three-dimensional Integrated Circuit (3D-IC). The 3D-IC includes a first tier device that includes: a first substrate and a first interconnect structure formed over the first substrate. The 3D-IC also includes a second tier device coupled to the first tier device. The second tier device includes: a second substrate, a doped region formed in the second substrate, a dummy gate formed over the substrate, and a second interconnect structure formed over the second substrate. The 3D-IC includes an inter-tier via extending vertically through the second substrate. The inter-tier via has a first end and a second end opposite the first end. The first end of the inter-tier via is coupled to the first interconnect structure. The second end of the inter-tier via is coupled to one of: the doped region, the dummy gate, or the second interconnect structure.

Another aspect of the present disclosure pertains to a three-dimensional Integrated Circuit (3D-IC). The 3D-IC includes a bottom tier device that includes: a bottom substrate and a bottom interconnect structure located over the bottom substrate. The bottom interconnect structure includes a plurality of metal layers that each contain a plurality of metal lines. The 3D-IC includes a top tier device that includes: a top substrate, a plurality of circuit cells formed on the top substrate, a dummy gate that is not a functional part of any of the circuit cells located at an edge of one of the circuit cells, and a top interconnect structure located over the top substrate. The top interconnect structure includes a plurality of metal layers that each contain a plurality of metal lines. The top tier device is formed over the bottom tier device. The 3D-IC includes an inter-tier via extending vertically through the top substrate. The inter-tier via has a top end and a bottom end opposite the top end. The bottom end of the inter-tier via is directly connected to one of the metal lines of the bottom interconnect structure. The top end of the inter-tier via is directly connected to the dummy gate or one of the metal lines of the top interconnect structure.

Yet another aspect of the present disclosure pertains to a method of fabricating a three-dimensional Integrated Circuit (3D-IC). Microelectronic components are formed in a bottom substrate. A bottom interconnect structure is formed over the bottom substrate. The bottom interconnect structure includes a plurality of bottom metal layers that each contain a plurality of bottom metal lines. The bottom substrate and the bottom interconnect structure collectively form a bottom tier device of the 3D-IC. A top substrate is formed over the bottom tier device. Microelectronic components are formed in the top substrate. An inter-tier via is formed to extend vertically through the top substrate. At least one dummy gate is formed over the top substrate. A top interconnect structure is formed over the top substrate. The top interconnect structure includes a plurality of top metal layers that each contain a plurality of top metal lines. The top substrate and the top interconnect structure collectively form a top tier device of the 3D-IC. The inter-tier via is formed to electrically couple together the bottom tier device and at least one of: the microelectronic components formed in the top substrate, the at least one dummy gate, or the top interconnect structure.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
receiving a layout plan for an Integrated Circuit (IC) cell;
splitting the layout plan into a first portion of the IC cell and a second portion of the IC cell;
implementing the first portion of the IC cell on a first tier device;
implementing the second portion of the IC cell on a second tier device; and
electrically coupling the first tier device with the second tier device.

2. The method of claim 1, wherein the implementing the first portion of the IC and the implementing the second portion of the IC the first portion of the IC are performed such that the first tier device is stacked on top of the second tier device.

3. The method of claim 1, wherein the electrically coupling comprises implementing a plurality of inter-tier vias (ITVs) between the first tier device and the second tier device.

4. The method of claim 3, wherein the ITVs are not included in the received layout plan for the IC cell.

5. The method of claim 3, wherein the implementing the plurality of ITVs comprises: electrically coupling a first end of each of the ITVs with the first tier device and electrically coupling a second end of each of the ITVs with the second tier device.

6. The method of claim 5, wherein:
the electrically coupling the first end of each of the ITVs comprises electrically coupling the first end of each of the ITVs to a first metal line of a first interconnect structure of the first tier device; and
the electrically coupling the second end of each of the ITVs comprises electrically coupling the second end of each of the ITVs to a second metal line of a second interconnect structure of the first tier device.

7. The method of claim 5, wherein the implementing the plurality of ITVs comprises implementing the ITVs in a staggered arrangement in a top view.

8. The method of claim 3, further comprising: before the splitting, stretching the layout plan for the IC cell to create an extra space in the stretched layout plan, wherein the plurality of ITVs are implemented in the extra space.

9. The method of claim 1, wherein the splitting is performed such that the first portion of the IC cell is symmetrical to the second portion of the IC cell.

10. The method of claim 1, wherein the splitting is performed such that the first portion of the IC cell is asymmetrical to the second portion of the IC cell.

11. The method of claim 1, wherein the splitting comprises folding the second portion of the IC cell by 180 degrees before implementing the second portion of the IC cell on the second tier device.

12. The method of claim 1, wherein:
the layout plan includes a first power rail and a first ground rail;
the splitting comprises splitting the first power rail into a second power rail and a third power rail and splitting the first ground rail into a second ground rail and a third ground rail;
the implementing the first portion of the IC comprises implementing the second power rail and the second ground rail on the first tier device; and
the implementing the second portion of the IC comprises implementing the third power rail and the third ground rail on the second tier device.

13. The method of claim 1, further comprising: performing a layout rule check on the layout plan after the splitting.

14. A method, comprising:
accessing a layout plan of an Integrated Circuit (IC) cell;
splitting the layout plan into a first region of the IC cell and a second region of the IC cell;
implementing the first region of the IC cell on a first tier device;
implementing the second region of the IC cell on a second tier device; and
electrically coupling, through one or more inter-tier vias (ITVs), the first tier device with the second tier device.

15. The method of claim 14, wherein the accessed layout plan of the IC cell is free of the ITVs.

16. The method of claim 14, wherein the first tier device and the second tier device are located at different levels.

17. The method of claim 14, wherein:
a first end of each of the one or more ITVs is electrically connected to a respective first metal line of the first tier device; and
a second end of each of the one or more ITVs is electrically connected to a respective second metal line of the second tier device.

18. The method of claim 14, wherein the electrically coupling is performed using a plurality of ITVs that have a staggered arrangement in a top view.

19. A method, comprising:
accessing a layout plan of an Integrated Circuit (IC) cell;
dividing the layout plan into a first portion of the IC cell and a second portion of the IC cell;
implementing the first portion of the IC cell on a first tier device located at a first level;
implementing the second portion of the IC cell on a second tier device located at a second level different from the first level; and
electrically coupling, through a plurality of inter-tier vias (ITVs) that have a staggered arrangement in a top view, the first tier device with the second tier device, wherein the accessed layout plan of the IC cell lacks the ITVs.

20. The method of claim 19, further comprising: before the dividing, stretching the layout plan of the IC cell, thereby creating an extra space in the stretched layout plan, wherein the plurality of ITVs are implemented in the extra space.

* * * * *